US012673965B2

(12) United States Patent
Harada et al.

(10) Patent No.: US 12,673,965 B2
(45) Date of Patent: Jul. 7, 2026

(54) RAW MATERIAL FOR CHEMICAL DEPOSITION CONTAINING ORGANORUTHENIUM COMPOUND, AND CHEMICAL DEPOSITION METHOD USING THE RAW MATERIAL FOR CHEMICAL DEPOSITION

(71) Applicant: TANAKA KIKINZOKU KOGYO K.K., Tokyo (JP)

(72) Inventors: Ryosuke Harada, Tsukuba (JP); Tomohiro Tsugawa, Tsukuba (JP); Shigeyuki Ootake, Tsukuba (JP); Seung-Joon Lee, Tsukuba (JP); Yohei Kotsugi, Tsukuba (JP)

(73) Assignee: TANAKA PRECIOUS METAL TECHNOLOGIES Co., Ltd., Tokyo (JP)

( * ) Notice: Subject to any disclaimer, the term of this patent is extended or adjusted under 35 U.S.C. 154(b) by 803 days.

(21) Appl. No.: 17/796,535

(22) PCT Filed: Jan. 28, 2021

(86) PCT No.: PCT/JP2021/002934
§ 371 (c)(1),
(2) Date: Jul. 29, 2022

(87) PCT Pub. No.: WO2021/153640
PCT Pub. Date: Aug. 5, 2021

(65) Prior Publication Data

US 2023/0348511 A1 Nov. 2, 2023

(30) Foreign Application Priority Data

Jan. 31, 2020 (JP) ................................ 2020-014865

(51) Int. Cl.
*C07F 15/00* (2006.01)
*H10P 14/40* (2026.01)

(52) U.S. Cl.
CPC ........ *C07F 15/0046* (2013.01); *H10P 14/418* (2026.01)

(58) Field of Classification Search
CPC ....... C07F 15/00; C07F 15/0046; C23C 16/18
See application file for complete search history.

(56) References Cited

U.S. PATENT DOCUMENTS 5,962,716 A * 10/1999 Uhlenbrock ........ C07F 15/0026 556/136
6,303,809 B1 10/2001 Chi et al.
6,465,669 B1 10/2002 Okamoto
2010/0261350 A1 10/2010 Kanjolia et al.
2011/0165780 A1 7/2011 Kanjolia et al.
2011/0318488 A1* 12/2011 Saito ................ C23C 16/45553 556/136
2020/0339617 A1 10/2020 Kim et al.
2022/0018018 A1 1/2022 Harada et al.

FOREIGN PATENT DOCUMENTS

JP 2000-281694 A 10/2000
JP 2010-534769 A 11/2010
JP 2011-522124 A 7/2011
JP 2012-006858 A 1/2012
JP 2020-090689 A 6/2020
WO WO-2019/088722 A1 5/2019

OTHER PUBLICATIONS

Behrens (Journal of Organometallic Chemistry; 1980, 192, 389-398).*
Office Action issued in corresponding Chinese Patent Application No. 202180011325.8 dated Feb. 29, 2024 (11 pages).
International Searching Authority, "International Search Report," issued in connection with International Patent Application No. PCT/JP2021/002934, dated Apr. 13, 2021.
International Searching Authority, "Written Opinion," issued in connection with International Patent Application No. PCT/JP2021/002934, dated Apr. 13, 2021.
Chung et al., "Electrical and Structural Properties of Ruthenium Film Grown by Atomic Layer Deposition using Liquid-Phase $Ru(CO)_3$ $(C_6H_8)$ Precursor," Materials Research Society Symposia Proceedings, vol. 990, 2007 (8 pages).
Office Action issued in corresponding Japanese Patent Application No. 2021-574086, dated Feb. 27, 2023.

* cited by examiner

*Primary Examiner* — Pancham Bakshi
(74) *Attorney, Agent, or Firm* — Foley & Lardner LLP

(57) ABSTRACT

The present invention relates to an organoruthenium compound raw material for a chemical deposition method. An organoruthenium compound is represented by the following Formula 1 in which a trimethylenemethane-based ligand ($L_1$), and two carbonyl ligands and a ligand X coordinate to divalent ruthenium. In Formula 1, the trimethylenemethane-based ligand ($L_1$) is represented by the following Formula 2. Besides, the ligand X is any one of an isocyanide ligand, a pyridine ligand, an amine ligand, an imidazole ligand, a pyridazine ligand, a pyrimidine ligand, and a pyrazine ligand.

[Formula 1]

$RuL_1(CO)_2X$

[Formula 2]

$L_1$ =

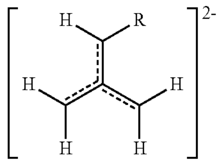

wherein a substituent R of the ligand $L_1$ is hydrogen, or any one of an alkyl group, a cyclic alkyl group, an alkenyl group, an alkynyl group, and an amino group having a predetermined number of carbon atoms.

13 Claims, 7 Drawing Sheets

RAW MATERIAL FOR CHEMICAL DEPOSITION CONTAINING ORGANORUTHENIUM COMPOUND, AND CHEMICAL DEPOSITION METHOD USING THE RAW MATERIAL FOR CHEMICAL DEPOSITION

CROSS-REFERENCE TO RELATED APPLICATIONS

The present application claims priority under 37 U.S.C. § 371 to International Patent Application No. PCT/JP2021/002934, filed Jan. 28, 2021, which claims priority to and the benefit of Japanese Patent Application No. 2020-014865, filed on Jan. 31, 2020. The contents of these applications are hereby incorporated by reference in their entireties.

BACKGROUND OF THE INVENTION

Field of the Invention

The present invention relates to a raw material for chemical deposition containing an organoruthenium compound for producing a ruthenium thin film or a ruthenium compound thin film by a chemical deposition method (chemical vapor deposition (CVD) or atomic layer deposition (ALD)). More particularly, it relates to a raw material for chemical deposition having a low decomposition temperature and adequate thermal stability.

Description of the Related Art

Thin films containing ruthenium or a ruthenium compound are used as wiring/electrode materials of semiconductor devices such as a DRAM and an FERAM. As a method for producing such a thin film, a chemical deposition method such as CVD (chemical vapor deposition) or ALD (atomic layer deposition) is applied. As a raw material (precursor) used in such a chemical deposition method, a large number of organoruthenium compounds have been conventionally known.

As an organoruthenium compound used as a raw material for chemical deposition, for example, Patent Document 1 discloses bis(ethylcyclopentadienyl)ruthenium (II) represented by Formula 1 and including cyclopentadienyl, that is, a cyclic dienyl, or a derivative thereof coordinated. This organoruthenium compound is known as a raw material compound for chemical deposition from a comparatively long time ago.

[Formula 1]

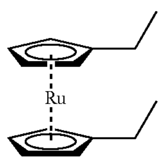

(1,3-Cyclohexadiene)tricarbonyl ruthenium of Formula 2 using cyclohexadienyl and carbonyl as ligands is also useful as the organoruthenium compound used as a raw material for chemical deposition (Patent Document 3, and Non Patent Document 1).

[Formula 2]

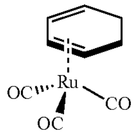

In addition, an organoruthenium compound in which a β-diketonato ligand is applied as a ligand coordinating to ruthenium is also useful. For example, known from Patent Document 2 are dicarbonyl-bis(tetramethylheptanedionate) ruthenium represented by Formula 3 and including tetramethylheptanedionate and carbonyl coordinated, and tris(acetylacetonato)ruthenium of Formula 4 including three acetylacetonato coordinated as β-diketonato ligands. Patent Document 4 discloses dicarbonyl-bis(5-methyl-2,4-hexanediketonato)ruthenium represented by Formula 5.

[Formula 3]

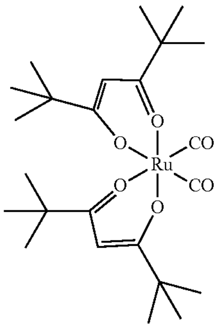

[Formula 4]

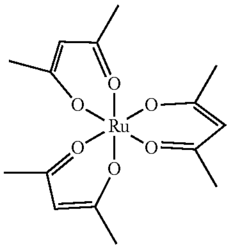

[Formula 5]

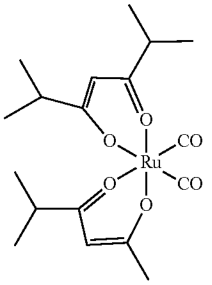

PRIOR ART DOCUMENT

Patent Document

Patent Document 1
Japanese Patent Application Laid-Open No: 2000-281694
Patent Document 2
U.S. Pat. No. 6,303,809
Patent Document 3

U.S. Pat. No. 5,962,716

Patent Document 4

Japanese Patent Application Laid-Open No. 2012-006858

Non Patent Document

Non Patent Document 1

Materials Research Society Symposium B-Materials, Processes, Integration and Reliability in Advanced Interconnects for micro- and Nanoelectronics, 2007, 990. 0990-B08-01

SUMMARY OF THE INVENTION

Technical Problem

Properties required of an organoruthenium compound for chemical deposition have been mainly basic properties in thin film formation, such as possibility/efficiency of ruthenium thin film formation, and handleability as a raw material. A chemical deposition method is a method including vaporizing a raw material compound to obtain a raw material gas, transporting the raw material gas onto a substrate, and decomposing the raw material gas on the substrate to form a thin film. In this process, it is necessary to rapidly vaporize the raw material compound, and therefore, a compound that has a vaporization property with a high vapor pressure so as to easily vaporize to a raw material gas has been regarded as favorable.

In accordance with increase in electrode/wire density and increase in resolution in various semiconductor devices, properties required of an organoruthenium compound used as a raw material for chemical deposition have become diverse.

One of such property requirements is expansion of an applicable range of reaction gases usable in film formation process. Since an organoruthenium compound decomposes by heating, ruthenium can be deposited from a single compound. In order to decompose the compound at an appropriate film forming temperature to ensure a deposition rate, however, a reaction gas is introduced together with a raw material in general. As the reaction gas, oxygen is used in many cases. In next generation semiconductor devices, however, antioxidation of a thin film and an underlying substrate is demanded. In order to prevent oxidation of a thin film and a substrate in film formation by a chemical deposition method, a reducing gas such as hydrogen is preferably used as the reaction gas. In other words, an organoruthenium compound having high reactivity even in the presence of a reducing gas such as hydrogen is demanded.

The above-described conventional organoruthenium compounds meet the basic property requirements, but are difficult to cope with widening of the applicable range of reaction gasses and the requirements in thermal stability. For example, the organoruthenium compound of Formula 1 has a high vapor pressure, and is also excellent in handleability because it is in a liquid state at normal temperature, and hence has been a useful organoruthenium compound under conventional film forming conditions. It is, however, necessary to use oxygen as the reaction gas for this organoruthenium compound, and hence the requirement in antioxidation of a substrate cannot be met.

The organoruthenium compound of Formula 2 is a compound having a high vapor pressure, and hence is a favorable compound under the conventional film forming conditions. In addition, a hydrogen gas can be used as the reaction gas for this organoruthenium compound. This organoruthenium compound is, however, insufficient in reactivity with a hydrogen gas, and also has a problem of thermal stability. A compound having low thermal stability decomposes in a portion apart from a substrate surface, and hence a raw material is difficult to be stably supplied, which lowers the yield and deteriorates the handleability. Therefore, an organoruthenium compound having adequately high thermal stability is demanded.

As for the above-described organoruthenium compounds of Formula 3, Formula 4 and Formula 5, a range of choice of the reaction gas is comparatively wide, and it is deemed that a hydrogen gas can be used. In these organoruthenium compounds, however, the β-diketonato ligand used as the ligand contains an oxygen atom in the structure, and this oxygen atom directly coordinates to ruthenium that is a metal atom. The organoruthenium compound in which an oxygen atom directly coordinates to a ruthenium atom is insufficient in reactivity with a reaction gas of hydrogen, and the oxygen atom may mix in a ruthenium thin film in some cases. Also when oxygen is used as the reaction gas, oxygen may mix in a ruthenium thin film. The mixture of oxygen in a ruthenium thin film is also mentioned in Patent Document 2, and it is revealed that a ruthenium thin film contains about 3% of oxygen. The oxygen thus mixing in the ruthenium thin film may affect properties of electrode materials, for example, may increase specific resistance in some cases. Besides, since the reactivity with a hydrogen gas of these organoruthenium compounds is actually not sufficient, these compounds are not suitable for efficient film formation in the presence of a hydrogen gas. Therefore, also in the film formation using the organoruthenium compounds of Formula 3, Formula 4 and Formula 5, an oxygen gas is used in many cases.

As described so far, raw materials for chemical deposition containing the conventional organoruthenium compounds do not always cope with the diversifying property requirements. Therefore, the present invention provides an organoruthenium compound having favorable reactivity also with a reducing gas such as a hydrogen gas, and having adequate thermal stability, with the basic properties as a raw material for chemical deposition such as a vaporization property and handleability regarded as significant.

Solution to Problem

The present invention that solves the above-described problems is drawn to a raw material for chemical deposition for producing a ruthenium thin film or a ruthenium compound thin film by a chemical deposition method, containing an organoruthenium compound represented by the following Formula 6 in which a trimethylenemethane-based ligand ($L_1$), and two carbonyl ligands and a ligand X coordinate to divalent ruthenium.

$$RuL_1(CO)_2X \qquad \text{[Formula 6]}$$

In Formula 1, the trimethylenemethane-based ligand ($L_1$) is represented by the following Formula 2. Besides, the ligand X is any one of an isocyanide ligand ($L_2$), a pyridine ligand ($L_3$), an amine ligand ($L_4$), an imidazole ligand ($L_5$), a pyridazine ligand ($L_6$), a pyrimidine ligand ($L_7$), and a pyrazine ligand ($L_8$) represented by the following Formula 8 to Formula 14:

[Formula 7]

$L_1$ =

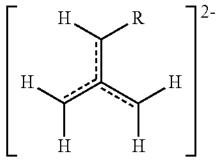

wherein a substituent R of the ligand $L_1$ is any one of hydrogen, a linear or branched alkyl group having 1 or more and 8 or less carbon atoms, a cyclic alkyl group having 3 or more and 9 or less carbon atoms, a linear or branched alkenyl group having 2 or more and 8 or less carbon atoms, a linear or branched alkynyl group having 2 or more and 8 or less carbon atoms, a linear or branched amino group having 2 or more and 8 or less carbon atoms, and an aryl group having 6 or more and 9 or less carbon atoms.

[Formula 8]

$L_2$ =

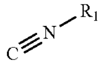

wherein a substituent $R_1$ of the ligand $L_2$ is any one of hydrogen, a linear or branched alkyl group having 1 or more and 8 or less carbon atoms, a cyclic alkyl group having 3 or more and 9 or less carbon atoms, a linear or branched amino group having 1 or more and 8 or less carbon atoms, an aryl group having 6 or more and 9 or less carbon atoms, a linear or branched alkoxy group having 1 or more and 8 or less carbon atoms, a linear or branched cyano group having 1 or more and 8 or less carbon atoms, a linear or branched nitro group having 1 or more and 8 or less carbon atoms, and a linear or branched fluoroalkyl group having 1 or more and 8 or less carbon atoms.

[Formula 9]

$L_3$ =

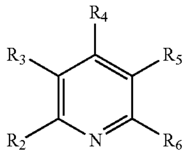

wherein each of substituents $R_2$ to $R_6$ of the ligand $L_3$ is any one of hydrogen, a linear or branched alkyl or fluoroalkyl group having 1 or more and 5 or less carbon atoms, a linear or branched alkoxy group having 1 or more and 5 or less carbon atoms, a fluoro group, a linear or branched cyano group having 1 or more and 5 or less carbon atoms, and a linear or branched nitro group having 1 or more and 5 or less carbon atoms.

[Formula 10]

$L_4$ =

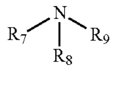

wherein each of substituents $R_7$ to $R_9$ of the ligand $L_4$ is a linear or branched alkyl group having 1 or more and 5 or less carbon atoms.

[Formula 11]

$L_5$ =

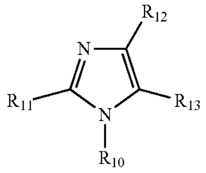

wherein a substituent $R_{10}$ of the ligand $L_5$ is any one of hydrogen, a linear or branched alkyl group having 1 or more and 8 or less carbon atoms, a cyclic alkyl group having 3 or more and 8 or less carbon atoms, and a linear or branched fluoroalkyl group having 1 or more and 8 or less carbon atoms. Each of substituents $R_{11}$ to $R_{13}$ is any one of hydrogen, a linear or branched alkyl group having 1 or more and 5 or less carbon atoms, a linear or branched amino group having 1 or more and 5 or less carbon atoms, a linear or branched alkoxy group having 1 or more and 5 or less carbon atoms, a linear or branched cyano group having 1 or more and 5 or less carbon atoms, a linear or branched nitro group having 1 or more and 5 or less carbon atoms, a fluoro group, and a linear or branched fluoroalkyl group having 1 or more and 5 or less carbon atoms.

[Formula 12]

$L_6$ =

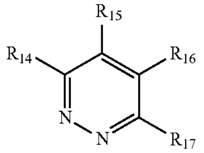

wherein each of substituents $R_{14}$ to $R_{17}$ of the ligand $L_6$ is any one of hydrogen, a linear or branched alkyl group having 1 or more and 5 or less carbon atoms, a linear or branched fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms.

[Formula 13]

$L_7$ =

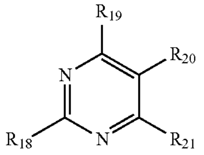

wherein each of substituents $R_{18}$ to $R_{21}$ of the ligand $L_7$ is any one of hydrogen, a linear or branched alkyl group having 1 or more and 5 or less carbon atoms, a linear or branched fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms.

[Formula 14]

$L_8$ = 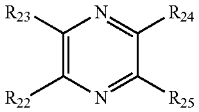

wherein each of substituents $R_{22}$ to $R_{25}$ of the ligand $L_8$ is any one of hydrogen, a linear or branched alkyl group having 1 or more and 5 or less carbon atoms, a linear or branched fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms.

The organoruthenium compound contained in the raw material for chemical deposition of the present invention solves the above-described problems owing to two features that (1) the trimethylenemethane-based ligand ($L_1$) is applied as the ligand, and that (2) a combination of the two carbonyl ligands and the ligand X ($L_2$, $L_3$, $L_4$, $L_5$, $L_6$, $L_7$ or $L_8$) is applied. These features will now be described in detail.

(1) Application of Trimethylenemethane-Based Ligand

In the present invention, the trimethylenemethane-based ligand refers to a ligand containing trimethylenemethane ($\eta^4$-methylene-1,3-propanediyl), or a ligand containing a trimethylenemethane derivative obtained by introducing a substituent into trimethylenemethane (Formula 7). As compared with ligands of conventional organoruthenium compounds for chemical deposition, the trimethylenemethane-based ligand has the following advantages.

Trimethylenemethane used as a base of the trimethylenemethane-based ligand is a tridentate ligand having fewer carbon skeletons containing carbon and hydrogen. Therefore, this ligand does not contain an element that can be an impurity in a ruthenium thin film. In particular, the trimethylenemethane-based ligand does not contain an oxygen atom capable of directly coordinating to ruthenium differently from a β-diketonate ligand. In addition, this ligand has good reactivity with a hydrogen gas as described later, and hence mixture of oxygen in the ruthenium thin film and oxidation of an underlying substrate are not liable to occur. According to the present invention, a high quality ruthenium thin film can be formed with the oxygen mixture in the film and substrate oxidation suppressed.

The trimethylenemethane-based ligand is a ligand coordinating to divalent ruthenium. On the contrary, a ligand of hexadiene of Formula 2 or the like is a ligand coordinating to zero-valent ruthenium. Here, a complex containing divalent ruthenium is liable to have higher binding strength to a ligand as compared with a complex containing zero valent ruthenium. Accordingly, the organoruthenium compound of the present invention is a compound having adequately high thermal stability.

The organoruthenium compound containing higher-valent (divalent) ruthenium is improved in reactivity with a hydrogen gas as compared with that of prior art. Therefore, for the organoruthenium compound of the present invention, a reducing gas such as hydrogen can be applied as a reaction gas.

The organoruthenium compound of the present invention has a structural advantage of a complex and high reactivity in a reducing atmosphere of hydrogen or the like as described above, and hence a problem of the quality of a substrate and a ruthenium thin film is solved. In addition, since adequate thermal stability is ensured, efficient film formation free from loss can be performed.

In addition, the organoruthenium compound of the present invention is also good in a high vapor pressure, that is, a property required as prerequisite of a raw material for chemical deposition. The vapor pressure of an organoruthenium compound is liable to correspond to a molecular weight of a ligand. The trimethylenemethane-based ligand is a ligand having fewer carbon skeletons and having a low molecular weight. Therefore, also because the carbonyl ligand described later also has a low molecular weight, an organoruthenium compound that has a high vapor pressure and easily vaporizes can be obtained.

As described so far, since the trimethylenemethane-based ligand is applied, the reactivity with a hydrogen gas is obtained, and in addition, various properties favorable as a constituent element of a raw material for chemical deposition can be exhibited.

In the present invention, not only trimethylenemethane but also a trimethylenemethane derivative can be applied as the trimethylenemethane-based ligand. A substituent is introduced into trimethylenemethane because a melting point can be lowered and a decomposition temperature and the vaporization property can be appropriately adjusted by imparting asymmetry to a complex structure. When a melting point is lowered, a raw material for chemical deposition in a liquid state at normal temperature can be obtained. When the decomposition temperature is appropriately adjusted, adequate thermal stability can be obtained, and efficient film formation can be performed by adjusting the vaporization property. In other words, when a trimethylenemethane derivative is applied, handleability more preferable as a material for chemical deposition, and thermal stability for performing stable and efficient film formation are exhibited in some cases.

In the present invention, when the trimethylenemethane derivative is applied as the trimethylenemethane-based ligand, the substituent R is any one of a linear or branched alkyl group having 1 or more and 8 or less carbon atoms, a cyclic alkyl group having 3 or more and 9 or less carbon atoms, a linear or branched alkenyl group having 2 or more and 8 or less carbon atoms, a linear or branched alkynyl group having 2 or more and 8 or less carbon atoms, a linear or branched amino group having 2 or more and 8 or less carbon atoms, and an aryl group having 6 or more and 9 or less carbon atoms. The substituent R is more preferably any one of a linear or branched alkyl group having 2 or more and 4 or less carbon atoms, a cyclic alkyl group having 5 or more and 8 or less carbon atoms, a linear or branched alkenyl group having 3 or more and 5 or less carbon atoms, a linear or branched alkynyl group having 3 or more and 5 or less carbon atoms, a linear or branched amino group having 3 or more and 5 or less carbon atoms, and an aryl group having 6 or more and 8 or less carbon atoms.

The substituent R is limited to the above-described hydrocarbon groups mainly containing carbon and hydrogen for excluding an element not preferable for a ruthenium thin film, such as oxygen, from constituent elements of the compound. Besides, the number of carbon atoms of the hydrocarbon group of the substituent R is limited for making the vaporization property favorable in consideration of the thermal stability of the organoruthenium compound.

Examples of the substituent R of the trim ethylenemethane-based ligand specifically include a methyl group, an ethyl group, a n-propyl group, an isopropyl group, a n-butyl group, an isobutyl group (2-methylpropyl), a sec-butyl group (1-methylpropyl), a tert-butyl group (1,1-dimethylethyl), a n-pentyl group, an isopentyl group (3-methylbutyl), a neopentyl group (2,2-dimethylpropyl), a sec-pentyl group (1-methylbutyl), a tert-pentyl group (1,1-dimethylpropyl), a n-hexyl group, an isohexyl group (4-methylpentyl), a neohexyl group (2,2-dimethylbutyl), a sec-hexyl group (1-methylpentyl), a tert-hexyl group (1,1-dimethylpentyl), a cyclohexyl group, a cyclohexylmethanyl group, and a phenyl group. More preferable examples include an ethyl group, a n-propyl group, a n-butyl group, an isobutyl group (2-methylpropyl), a n-pentyl group, an isopentyl group (3-methylbutyl), and a neopentyl group (2,2-dimethylpropyl). Among these specific examples, the particularly preferable substituent R is any one of a methyl group, an ethyl group, a n-propyl group, an isopropyl group, a n-butyl group, an isobutyl group, a sec-butyl group, a tert-butyl group, a n-pentyl group, an isopentyl group, and a neopentyl group.

(2) Application of Combination of Two Carbonyl Ligands and Ligand X

As exemplified by the compound of Formula 2 ((1,3-cyclohexadiene)tricarbonyl ruthenium) of the conventional technique described above, a carbonyl ligand used in an organoruthenium compound for chemical deposition is a known ligand. A carbonyl ligand is also good in binding strength to ruthenium, and can improve the thermal stability of the entire complex. Besides, the carbonyl ligand is also a ligand having a low molecular weight, and has an advantage that the vaporization property of the compound can be made favorable. As in the compound of Formula 2, however, three carbonyl ligands generally coordinate in the compound of the conventional technique.

In the present invention, one carbonyl ligand out of the three carbonyl ligands of the conventional compound is replaced with another ligand X. The combination of the two carbonyl ligands and the ligand X is applied for imparting asymmetry to a complex structure. It is intended that an asymmetric complex structure may bring optimization of a pyrolytic property and improvement of the reactivity with a reaction gas (such as a hydrogen gas).

As the ligand X, any one of the isocyanide ligand ($L_2$), the pyridine ligand ($L_3$), the amine ligand ($L_4$), the imidazole ligand ($L_5$), the pyridazine ligand ($L_6$), the pyrimidine ligand ($L_7$), and the pyrazine ligand ($L_8$) is applied. When the above-described effects are considered and a ligand having an adequate molecular weight is applied, the vaporization property such as a vapor pressure is adjusted. The respective ligands applied as the ligand X are specifically as follows.

(2-1) Isocyanide Ligand ($L_2$)

The isocyanide ligand ($L_2$) is a ligand represented by Formula 8 described above. The substituent $R_1$ of the ligand $L_2$ is hydrogen, a linear or branched alkyl group having 1 or more and 8 or less carbon atoms, a cyclic alkyl group having 3 or more and 9 or less carbon atoms, a linear or branched amino group having 1 or more and 8 or less carbon atoms, an aryl group having 6 or more and 9 or less carbon atoms, a linear or branched alkoxy group having 1 or more and 8 or less carbon atoms, a linear or branched cyano group having 1 or more and 8 or less carbon atoms, a linear or branched nitro group having 1 or more and 8 or less carbon atoms, or a linear or branched fluoroalkyl group having 1 or more and 8 or less carbon atoms. When the ligand X is the isocyanide ligand, the substituent $R_1$ of the ligand $L_2$ is preferably any one of a methyl group, an ethyl group, a n-propyl group, an isopropyl group, a n-butyl group, an isobutyl group, a sec-butyl group, a tert-butyl group, a cyclohexyl group, a trifluoromethyl group, and a pentafluoroethyl group.

(2-2) Pyridine Ligand ($L_3$)

The pyridine ligand ($L_3$) is a ligand represented by Formula 9 described above. Each of substituents $R_2$ to $R_6$ of the ligand $L_3$ is any one of hydrogen, a linear or branched alkyl or fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms. When the ligand X is the pyridine ligand, it is preferable that all of $R_2$ to $R_6$ are hydrogen, that all of $R_2$, $R_4$ and $R_6$ are methyl groups, and $R_3$ and $R_5$ are hydrogen, or that all of $R_2$, $R_3$, $R_5$ and $R_6$ are hydrogen, and $R_4$ is any one of a methyl group, an ethyl group, an isopropyl group, a tert-butyl group, a trifluoromethyl group, a methoxy group, a cyano group, and a nitro group.

(2-3) Amine Ligand ($L_4$)

The amine ligand ($L_4$) is a ligand represented by Formula 10 described above. Each of substituents $R_7$ to $R_9$ of the ligand $L_4$ is a linear or branched alkyl group having 1 or more and 5 or less carbon atoms. When the ligand X is the amine ligand, it is preferable that all of $R_7$ to $R_9$ are any one of a methyl group, an ethyl group, a n-propyl group, an isopropyl group, and a n-butyl group, or that both $R_7$ and $R_8$ are any one of a methyl group, an ethyl group, a n-propyl group, an isopropyl group, a n-butyl group, and a tert-butyl group, and $R_9$ is hydrogen.

(2-4) Imidazole Ligand ($L_5$)

The imidazole ligand ($L_5$) is a ligand represented by Formula 11 described above. A substituent $R_{10}$ of the ligand $L_5$ is any one of hydrogen, a linear or branched alkyl group having 1 or more and 8 or less carbon atoms, a cyclic alkyl group having 3 or more and 8 or less carbon atoms, and a linear or branched fluoroalkyl group having 1 or more and 8 or less carbon atoms. Each of substituents $R_{11}$ to $R_{13}$ is any one of hydrogen, a linear or branched alkyl group having 1 or more and 5 or less carbon atoms, a linear or branched amino group having 1 or more and 5 or less carbon atoms, a linear or branched alkoxy group having 1 or more and 5 or less carbon atoms, a linear or branched cyano group having 1 or more and 5 or less carbon atoms, a linear or branched nitro group having 1 or more and 5 or less carbon atoms, a fluoro group, and a linear or branched fluoroalkyl group having 1 or more and 5 or less carbon atoms. When the ligand X is the imidazole ligand, it is preferable that all of $R_{10}$ to $R_{13}$ are hydrogen, that $R_{10}$ is any one of a methyl group, an ethyl group, an isopropyl group, a tert-butyl group, and a trifluoromethyl group, and $R_{11}$ to $R_{13}$ are any one of hydrogen, a methyl group and an ethyl group, or that $R_{10}$ is any one of a methyl group, an ethyl group, an isopropyl group, a tert-butyl group, and a trifluoromethyl group, and all of $R_{11}$ to $R_{13}$ are any one of hydrogen, a methyl group, and an ethyl group.

(2-5) Pyridazine Ligand ($L_6$)

The pyridazine ligand ($L_6$) is a ligand represented by Formula 12 described above. Each of substituents $R_{14}$ to $R_{17}$ of the ligand $L_6$ is any one of hydrogen, a linear or branched alkyl group having 1 or more and 5 or less carbon atoms, a linear or branched fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms. When the ligand X is the pyridazine ligand, it is preferable that all of $R_{14}$ to $R_{17}$ are hydrogen, that $R_{14}$ is any one of a methyl group, an ethyl group, an isopropyl group, a tert-butyl group, a trifluoromethyl group, a fluoro group, a methoxy group, a cyano group, and a nitro group, and $R_{15}$ to $R_{17}$ are any one of hydrogen, a methyl group and an ethyl group, that $R_{15}$ is any one of a methyl group, an ethyl group, an isopropyl group, and a tert-butyl group, and all of $R_{14}$, $R_{16}$ and $R_{17}$ are any one of hydrogen, a methyl group, and an ethyl group, or that both $R_{15}$ and $R_{16}$ are methyl groups, and both $R_{14}$ and $R_{17}$ are hydrogen.

(2-6) Pyrimidine Ligand ($L_7$)

The pyrimidine ligand ($L_7$) is a ligand represented by Formula 13 described above. Each of substituents $R_{18}$ to $R_{21}$ of the ligand $L_7$ is any one of hydrogen, a linear or branched alkyl group having 1 or more and 5 or less carbon atoms, a linear or branched fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms. When the ligand X is the pyrimidine ligand, it is preferable that all of $R_{18}$ to $R_{21}$ are hydrogen, that all of $R_{19}$, $R_{20}$ and $R_{21}$ are methyl groups, and $R_{18}$ is hydrogen, that $R_{18}$ is any one of a methyl group, an ethyl group, an isopropyl group, a tert-butyl group, a trifluoro group, a fluoro group, a methoxy group, a cyano group, and a nitro group, and $R_{19}$ to $R_{21}$ are any one of hydrogen, a methyl group, and an ethyl group, or that $R_{20}$ is any one of a methyl group, an ethyl group, an isopropyl group, a tert-butyl group, a trifluoro group, a fluoro group, a methoxy group, a cyano group, and a nitro group, and all of $R_{18}$, $R_{19}$ and $R_{21}$ are any one of hydrogen, a methyl group and an ethyl group.

(2-7) Pyrazine Ligand ($L_8$)

The pyrazine ligand ($L_8$) is a ligand represented by Formula 14 described above. Each of substituents $R_{22}$ to $R_{25}$ of the ligand $L_8$ is any one of hydrogen, a linear or branched alkyl group having 1 or more and 5 or less carbon atoms, a linear or branched fluoroalkyl group having 1 or more and 5 or less carbon atoms, a fluoro group, a linear or branched alkoxy group having 1 or more and 5 or less carbon atoms, a linear or branched cyano group having 1 or more and 5 or less carbon atoms, and a linear or branched nitro group having 1 or more and 5 or less carbon atoms. When the ligand X is the pyrazine ligand, it is preferable that all of $R_{22}$ to $R_{25}$ are hydrogen, that $R_{22}$ is any one of a methyl group, an ethyl group, an isopropyl group, a tert-butyl group, a trifluoromethyl group, a fluoro group, a methoxy group, a cyano group, and a nitro group, and $R_{23}$ to $R_{25}$ are any one of hydrogen, a methyl group, and an ethyl group, or that $R_{23}$ is any one of a methyl group, an ethyl group, an isopropyl group, a tert-butyl group, a trifluoromethyl group, a fluoro group, a methoxy group, a cyano group, and a nitro group, and all of $R_{22}$, $R_{24}$ and $R_{25}$ are any one of hydrogen, a methyl group, and an ethyl group.

(3) Specific Examples of Organoruthenium Compound of Invention

Specific examples of the organoruthenium compound of the present invention in which the trimethylenemethane-based ligand ($L_1$) and the ligand X (the isocyanide ligand ($L_2$), the pyridine ligand ($L_3$), the amine ligand ($L_4$), the imidazole ligand ($L_5$), the pyridazine ligand ($L_6$), the pyrimidine ligand ($L_7$), or the pyrazine ligand ($L_8$)) coordinate are as follows. It is noted that although examples of only a case where R of the trimethylenemethane-based ligand ($L_1$) is hydrogen are listed in the following specific examples, specific examples include but are not limited to those of a case where the trimethylenemethane derivative having the substituent R is used.

[Formula 15]

Compounds in which trimethylenemethane and isocyanide ligand coordinate

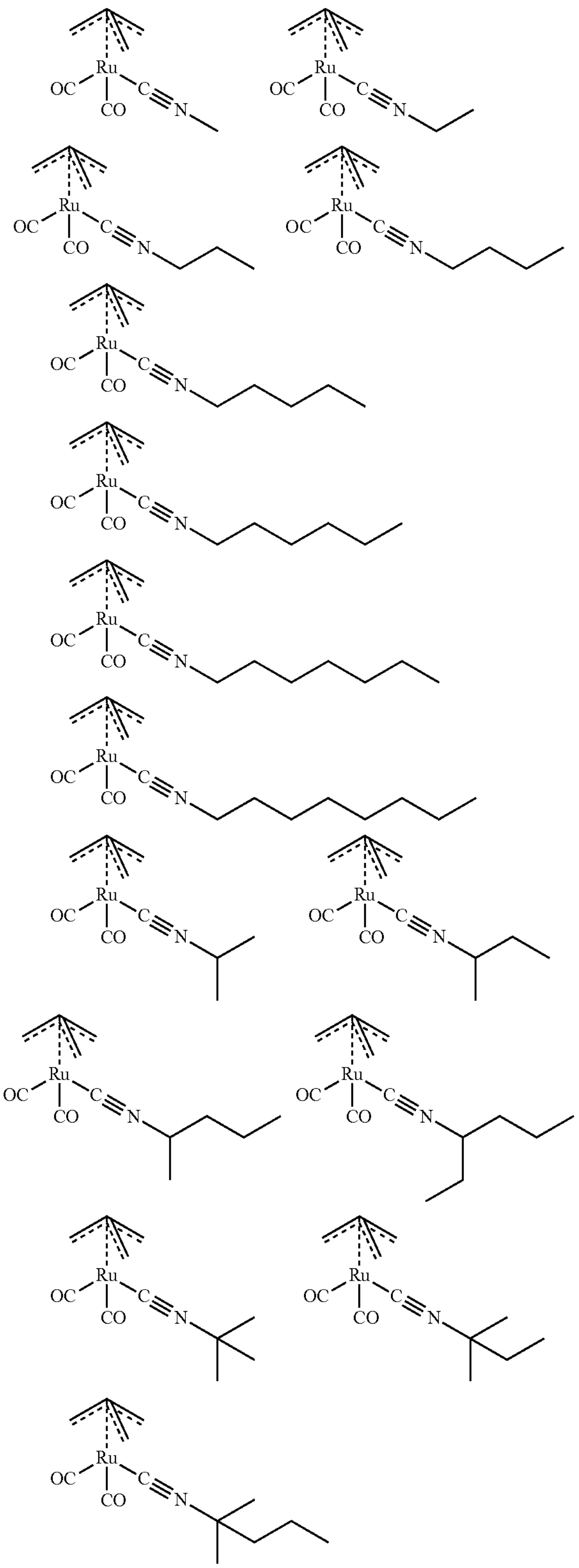

-continued
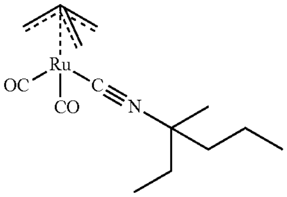
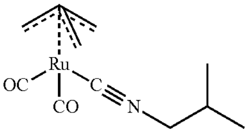
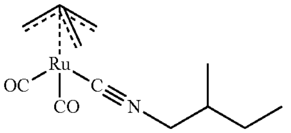
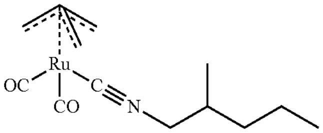
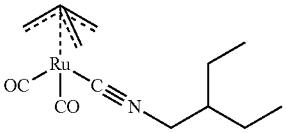
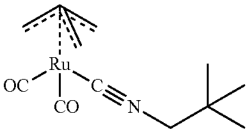
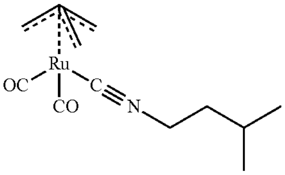
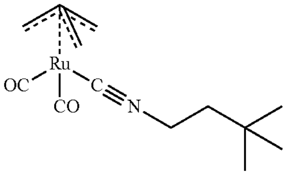
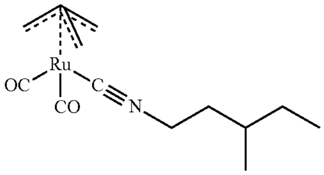
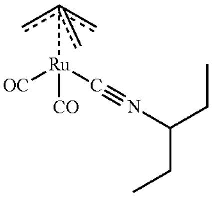
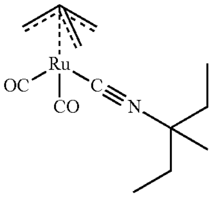
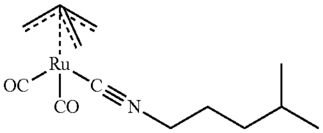
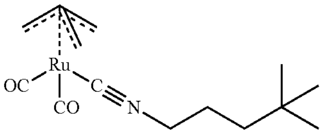
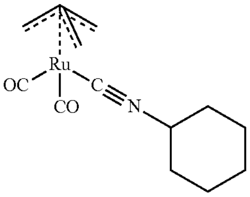
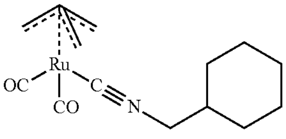
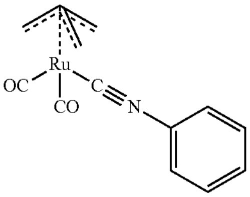
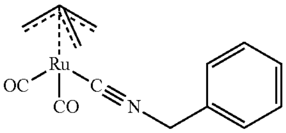
-continued
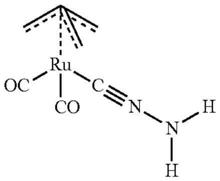
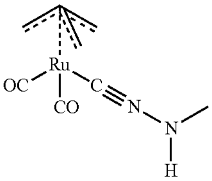
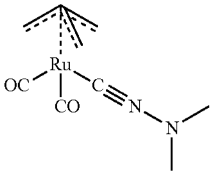
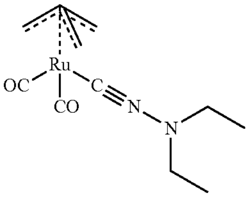
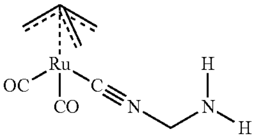
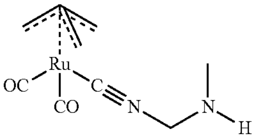
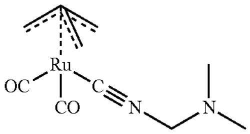
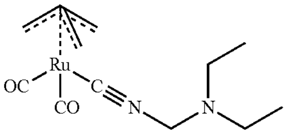
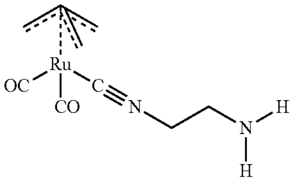
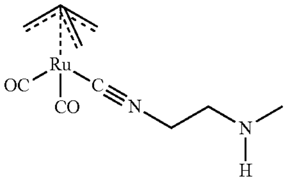
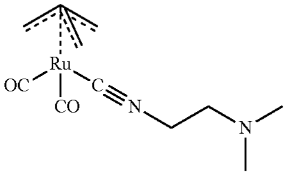
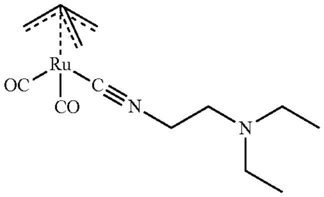
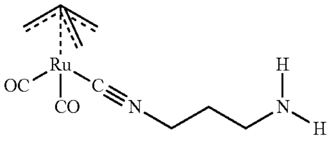
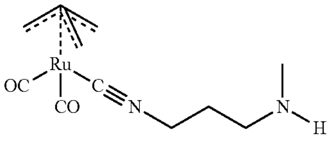

-continued
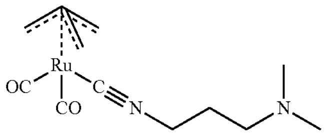
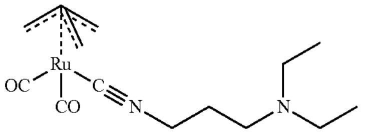
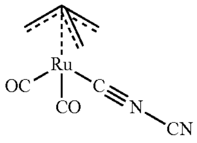
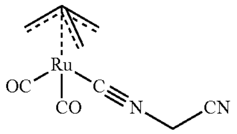
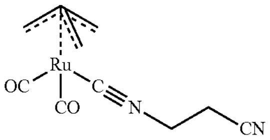
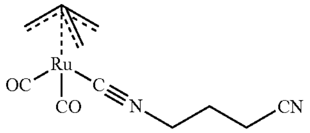
[Formula 16]
Compounds in which trimethylenemethane, carbonyl ligand and pyridine ligand coordinate
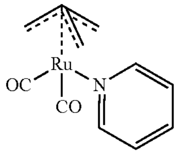
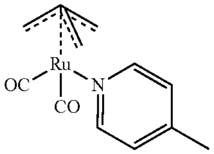
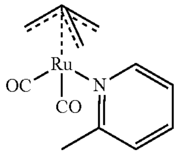
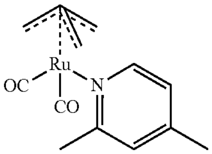
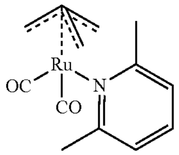
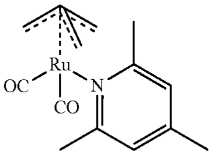
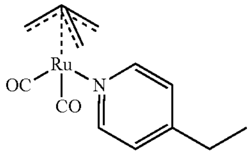
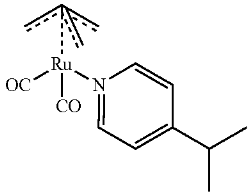
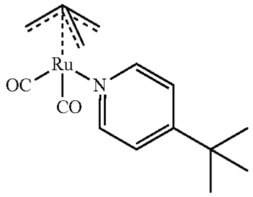
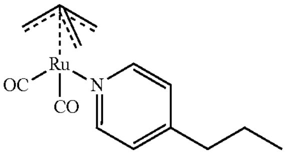
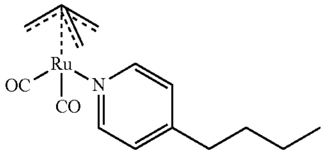
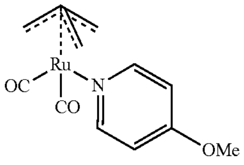
-continued
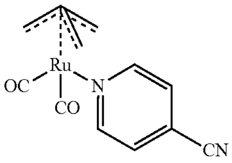
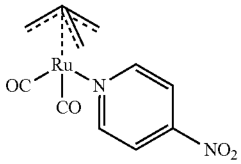
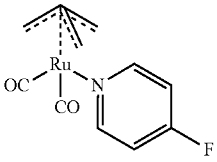
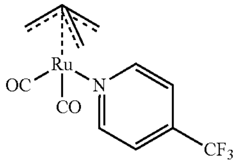
[Formula 17]
Compounds in which trimethylenemethane, carbonyl ligand and amine ligand coordinate
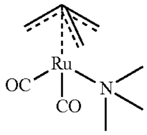
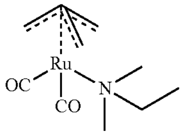
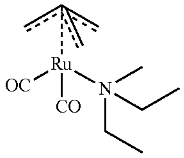
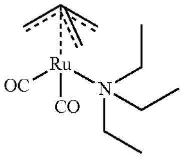
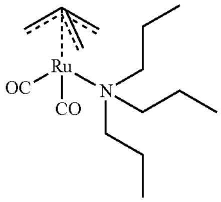
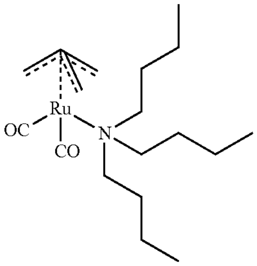
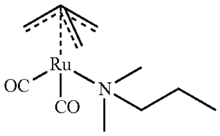
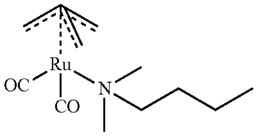
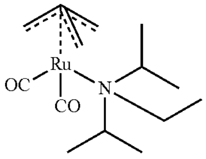
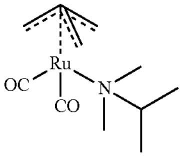

[Formula 18]
Compounds in which trimethylenemethane, carbonyl ligand and imidazole ligand coordinate
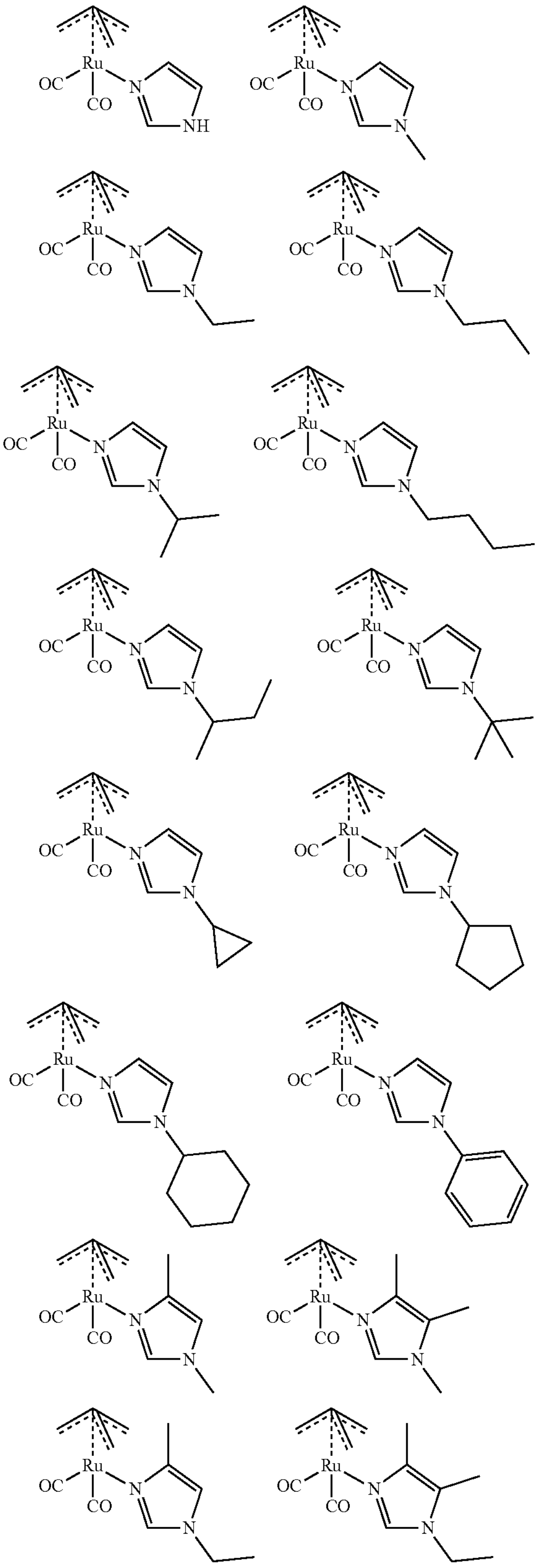
[Formula 19]
Compounds in which trimethylenemethane, carbonyl ligand and pyridazine ligand coordinate
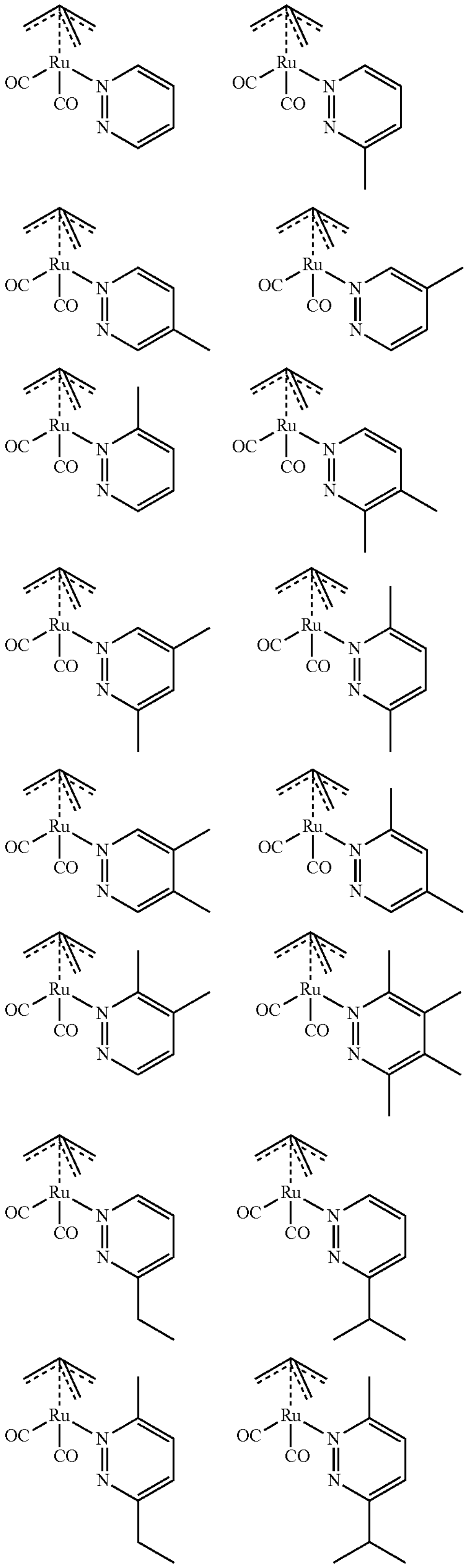

-continued
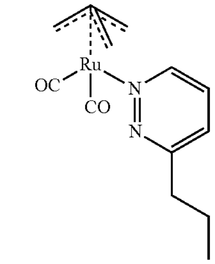
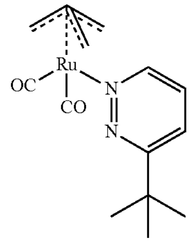
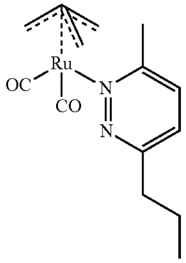
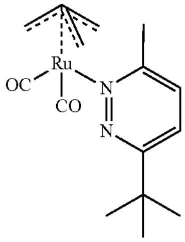
[Formula 20]
Compounds in which trimethylenemethane, carbonyl ligand and pyrimidine ligand coordinate
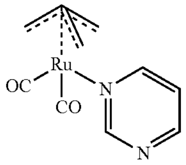
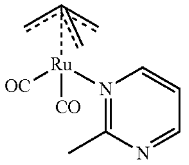
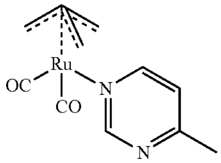
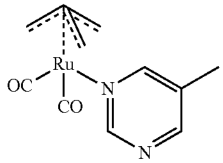
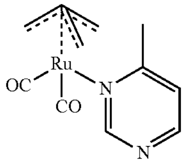
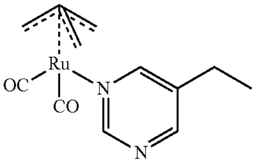
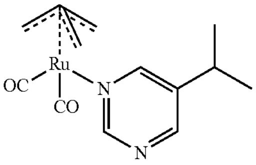
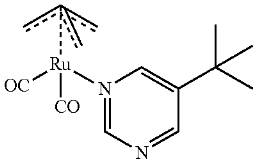
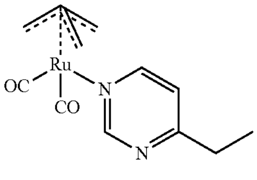
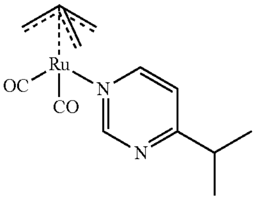
-continued
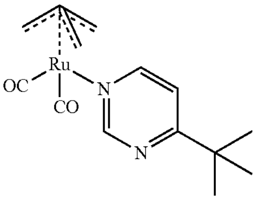
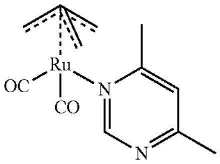
[Formula 21]
Compounds in which trimethylenemethane, carbonyl ligand and pyrazine ligand coordinate
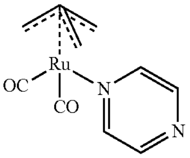
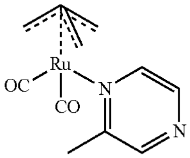
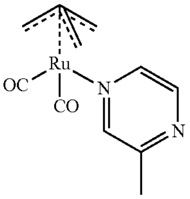
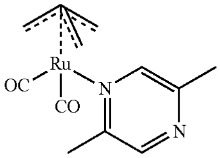
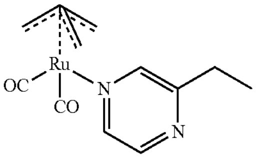
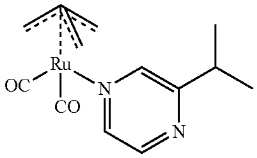
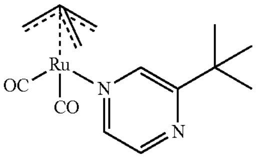
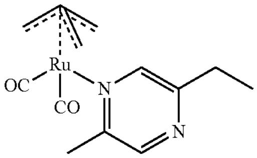
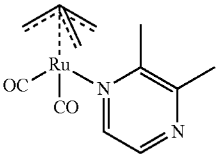
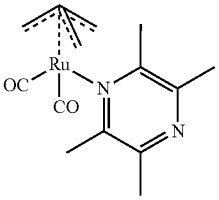
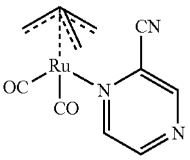
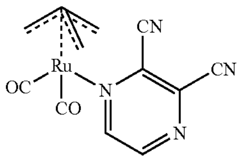
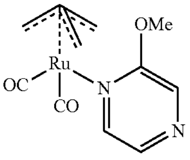
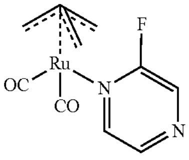

-continued

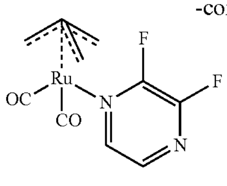

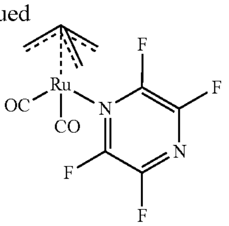

Next, a chemical deposition method for a ruthenium thin film or a ruthenium compound thin film in which the raw material for chemical deposition of the present invention is applied will be described. The chemical deposition method of the present invention includes vaporizing the raw material containing the organoruthenium compound described above by heating to thereby generate a raw material gas, and transporting the raw material gas onto a substrate surface, and thermally decomposing the organoruthenium compound to form a ruthenium thin film.

Regarding the form of the raw material in the chemical deposition method, the organoruthenium compound applied in the present invention has a high vapor pressure, and hence can easily vaporize to a raw material gas. Besides, a solution obtained by dissolving it in an appropriate solvent can be heated to obtain a raw material gas. A heating temperature for the raw material at this point is preferably 0° C. or more and 150° C. or less.

The vaporized raw material is joined with an appropriate carrier gas to be transported onto a substrate. In using the organoruthenium compound of the present invention, a ruthenium film can be formed with an inert gas (argon, nitrogen or the like) used as a carrier gas without using a reaction gas. For efficiently forming a ruthenium thin film, however, a reaction gas is preferably applied. Therefore, the raw material gas is preferably transported onto the substrate together with the reaction gas.

The raw material gas is transported together with the reaction gas to a reactor, and is heated on a substrate surface to form a ruthenium thin film thereon. In the film formation using the raw material for chemical deposition of the present invention, a reducing gas such as hydrogen can be used as the reaction gas. As the reducing gas, not only hydrogen but also a gas of ammonia, hydrazine, formic acid, an alcohol (methanol, ethanol, or isopropanol) or the like can be applied.

In the film formation of a ruthenium thin film or the like using the organoruthenium compound of the present invention, an oxidizing gas or a gas of an oxygen-containing reactant can be applied as the reaction gas. As described above, an oxidizing gas such as oxygen can cause substrate oxidation and oxygen mixture in a thin film, but if there is no need to concern for these, the film formation can be efficiently performed by using the oxidizing gas or the like as the reaction gas. Besides, in using the organoruthenium compound of the present invention, an oxide is comparatively liable not to be formed even when oxygen or the like is used as the reaction gas. Therefore, the oxidizing gas such as oxygen is also useful as the reaction gas. As the oxidizing gas, oxygen, ozone and the like can be used. Besides, the oxygen-containing reactant refers to a compound containing an oxygen atom as a constituent element, and having activity in a decomposition reaction of the organoruthenium compound. As the reaction gas of an oxygen-containing reactant, water, an alcohol or the like in the form of a gas can be used.

A film forming temperature employed in the film formation is preferably 150° C. or more and 350° C. or less. When the temperature is less than 150° C., the decomposition reaction of the organoruthenium compound is difficult to proceed, and hence the film formation cannot be efficiently performed. Meanwhile, when the film forming temperature is high beyond 350° C., it is difficult to form a uniform film, and in addition, there may arise a problem of damage of the substrate or the like. It is noted that the film forming temperature is usually adjusted in accordance with a substrate heating temperature.

Advantageous Effects of Invention

As described so far, ligands of an organoruthenium compound of the present invention have a suitable structure also from the viewpoints of a vapor pressure and the like. Accordingly, the vaporization property conventionally required of a raw material for chemical deposition is favorable.

Besides, the organoruthenium compound contained in a raw material for chemical deposition of the present invention has adequately high thermal stability due to selection of the ligands coordinating to ruthenium. In addition, it has good reactivity with a hydrogen gas or the like, and can form a film with a reducing gas used as a reaction gas. According to the present invention, high quality and highly efficient film formation of a ruthenium thin film can be performed in a reducing atmosphere of a hydrogen gas or the like, and substrate oxidation and oxygen mixture in the thin film can be suppressed at a high level. In this manner, the raw material for chemical deposition of the present invention is useful in electrode formation in a recent highly refined semiconductor device.

DETAILED DESCRIPTION OF THE PREFERRED EMBODIMENTS

Figure 1:
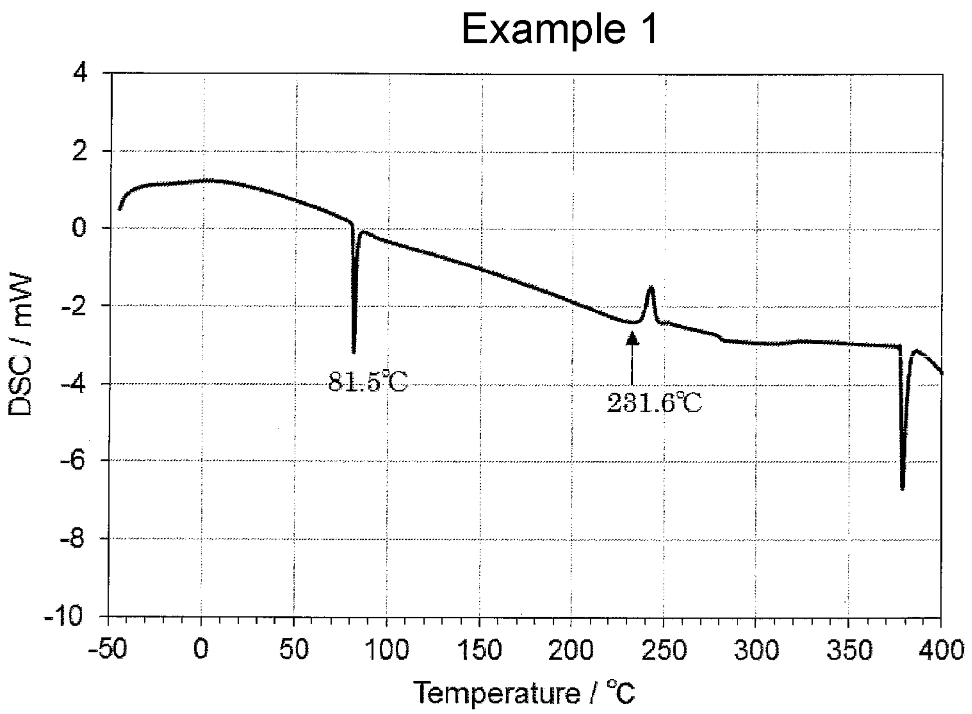
FIG. 1 is a diagram illustrating a DSC curve of an organoruthenium compound of Example 1.
Figure 2:
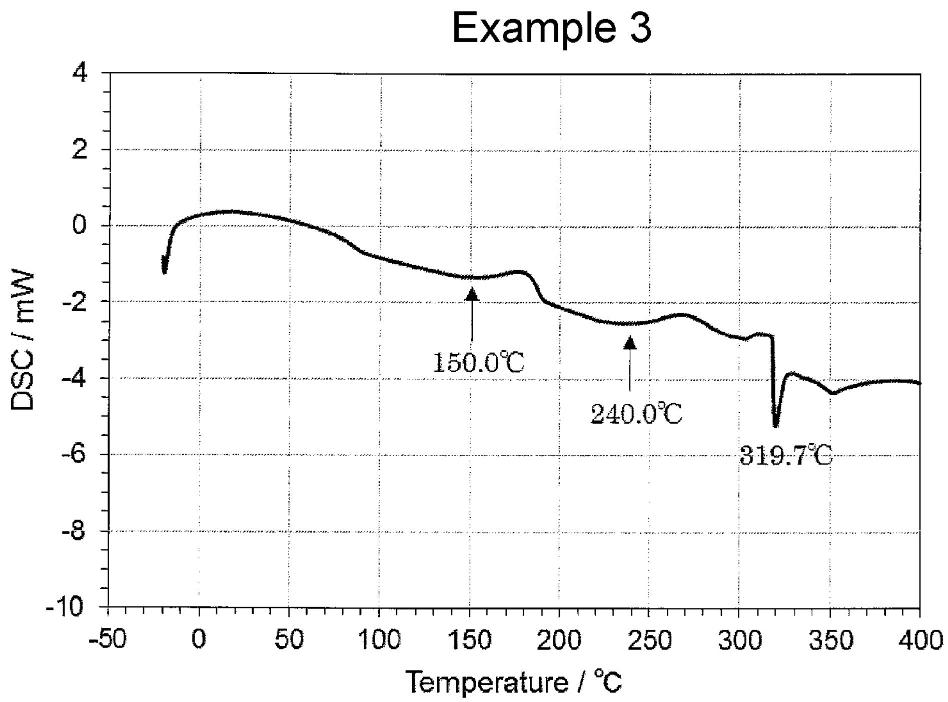
FIG. 2 is a diagram illustrating a DSC curve of an organoruthenium compound of Example 3.
Figure 3:
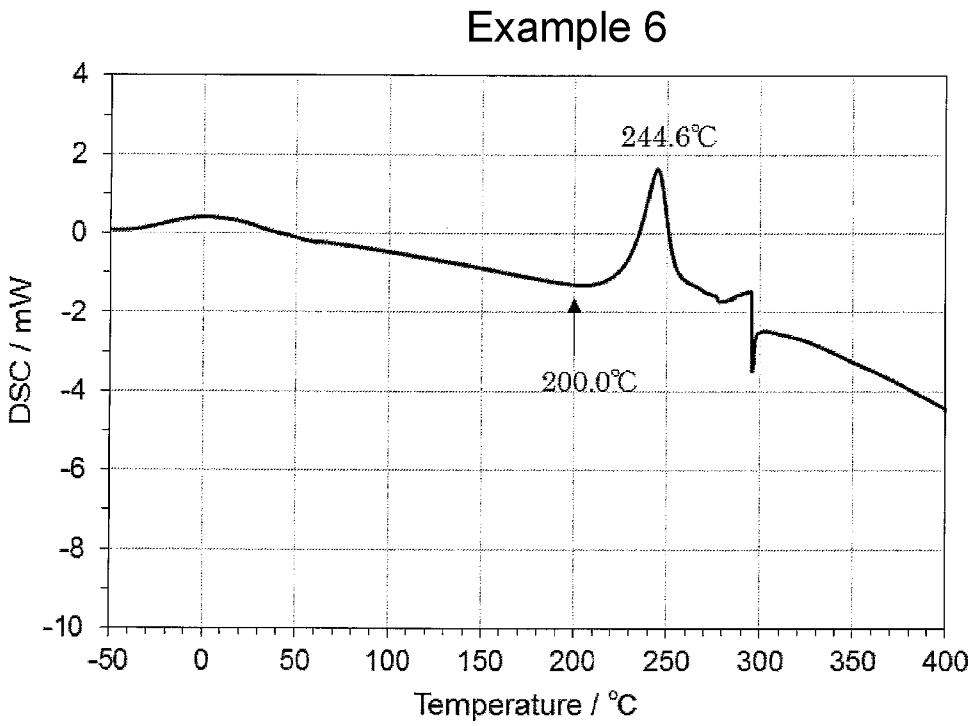
FIG. 3 is a diagram illustrating a DSC curve of an organoruthenium compound of Example 6.
Figure 4:
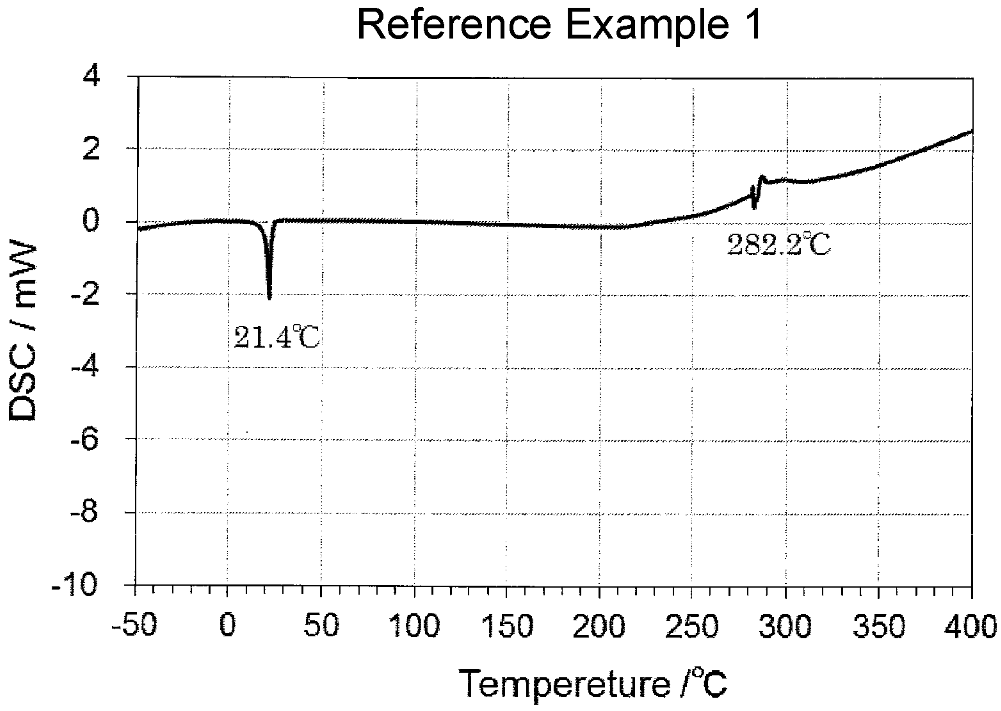
FIG. 4 is a diagram illustrating a DSC curve of an organoruthenium compound of Reference Example 1.
Figure 5:
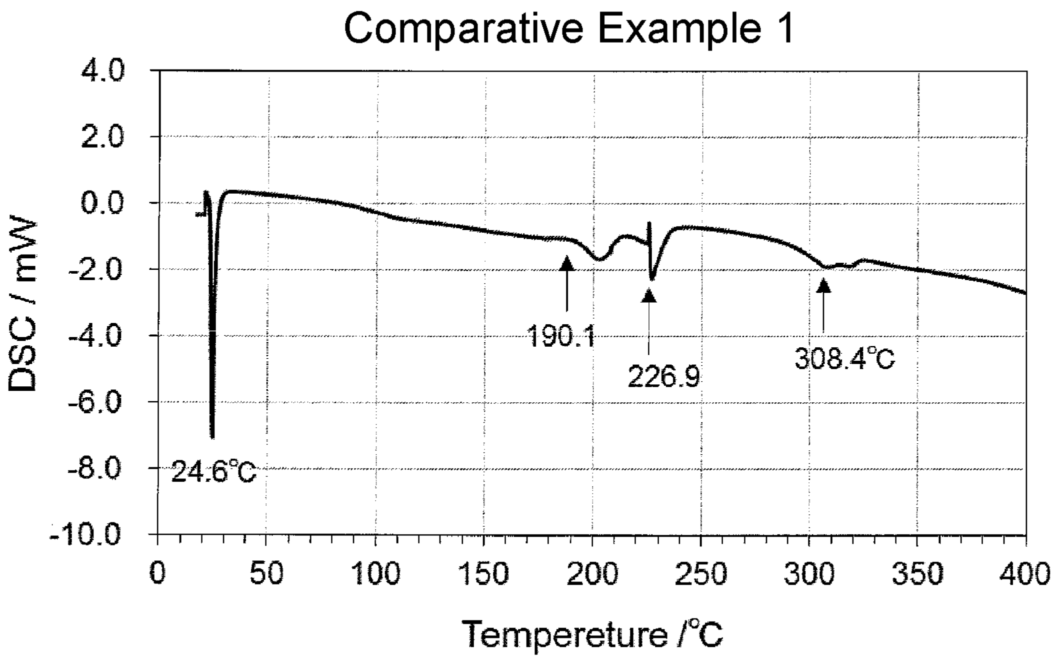
FIG. 5 is a diagram illustrating a DSC curve of an organoruthenium compound of Comparative Example 1.

First Embodiment: A most preferable embodiment of the present invention will now be described. In the present embodiment, it was confirmed whether or not an organoruthenium compound of the present invention could be synthesized. Then, the synthesized organoruthenium compound was evaluated for a physical property, and a film formation test of a ruthenium thin film was performed.

In the organoruthenium compounds synthesized in the present embodiment, trimethylenemethane (R=hydrogen) was used as a trimethylenemethane-based ligand ($L_1$). In addition, it was confirmed whether or not various organoruthenium compounds such as organoruthenium compounds in which an isocyanide ligand ($L_2$) coordinated as a ligand X (Examples 1 to 6), organoruthenium compounds in which a pyridine ligand ($L_3$) coordinated (Examples 7 and 8), an organoruthenium compound in which an amine ligand ($L_4$) coordinated (Example 9), organoruthenium compounds in which an imidazole ligand ($L_5$) coordinated (Examples 10 and 11), an organoruthenium compound in which a pyridazine ligand ($L_6$) coordinated (Example 12), an organoruthenium compound in which a pyrimidine ligand ($L_7$) coordinated (Example 13), and an organoruthenium compound in which a pyrazine ligand ($L_8$) coordinated (Example 14) could be synthesized.

[Synthesis of Organoruthenium Compounds]

Example 1: To a flask containing 700 ml of tetrahydrofuran, 16.8 g (70.0 mmol) of [tricarbonyl-(η4-methylene-1, 3-propanediyl)ruthenium], 14.5 g (75.0 mmol) of (2-isocyano-2-methylpropane), and 7.89 g (105 mmol) of trimethylamine N-oxide/dihydrate were added, and the resultant was heated at 60° C. for 12 hours. To a residue obtained by distilling off the solvent under reduced pressure, n-pentane was added for extraction, and the thus obtained solution was distilled off under reduced pressure. The thus obtained yellow solid was purified by sublimation to obtain 18.8 g (63.8 mmol) of a white solid as a target (yield: 91%). The synthesis reaction performed in this example is as follows:

[Formula 22]

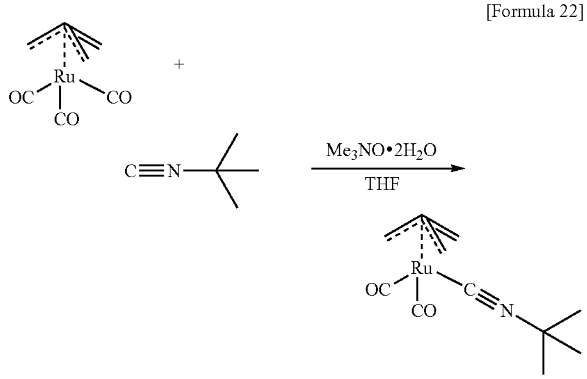

Example 2: To a flask containing 40 ml of tetrahydrofuran, 1.0 g (4.2 mmol) of [tricarbonyl-(η4-methylene-1,3-propanediyl)ruthenium], 0.50 g (7.2 mmol) of (2-isocyanopropane), and 3.0 g (9.2 mmol) of trimethylamine N-oxide/dihydrate were added, and the resultant was heated at 60° C. for 16 hours. To a residue obtained by distilling off the solvent under reduced pressure, n-pentane was added for extraction, and the thus obtained solution was distilled off under reduced pressure. The thus obtained solid was purified with an alumina column to obtain 0.68 g (2.5 mmol) of a white solid as a target (yield: 61%). The synthesis reaction performed in this example is as follows:

[Formula 23]

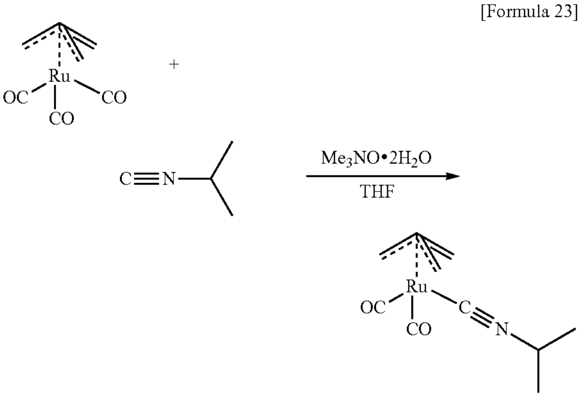

Example 3: To a flask containing 40 ml of tetrahydrofuran, 1.0 g (4.2 mmol) of [tricarbonyl-(η4-methylene-1,3-propanediyl)ruthenium], 0.69 g (8.4 mmol) of 2-isocyanobutane, and 3.0 g (9.2 mmol) of trimethylamine N-oxide/dihydrate were added, and the resultant was heated at 60° C. for 18 hours. To a residue obtained by distilling off the solvent under reduced pressure, n-pentane was added for extraction, and the thus obtained solution was distilled off under reduced pressure. The thus obtained residue was purified with an alumina column to obtain 0.25 g (0.84 mmol) of a colorless liquid as a target (yield: 20%). The synthesis reaction performed in this example is as follows:

[Formula 24]

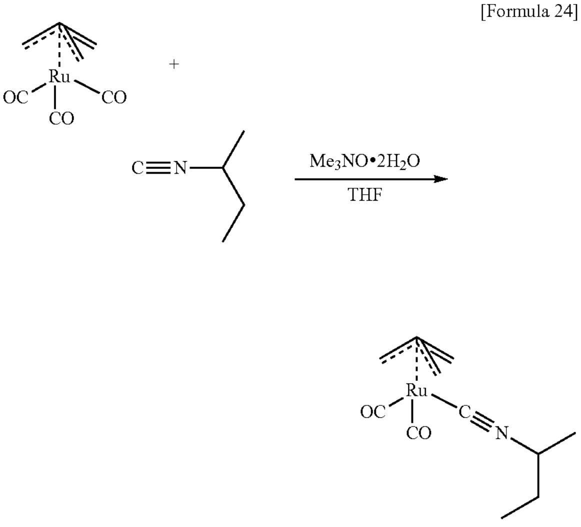

Example 4: To a flask containing 40 ml of tetrahydrofuran, 1.0 g (4.2 mmol) of [tricarbonyl-(η4-methylene-1,3-propanediyl)ruthenium], 0.87 g (8.0 mmol) of isocyanocyclohexane, and 3.0 g (9.2 mmol) of trimethylamine N-oxide/dihydrate were added, and the resultant was heated at 60° C. for 10 hours. To a residue obtained by distilling off the solvent under reduced pressure, n-pentane was added for extraction, and the thus obtained solution was distilled off under reduced pressure. The thus obtained residue was purified with an alumina column to obtain 0.55 g (1.7 mmol) of a white solid as a target (yield: 41%). The synthesis reaction performed in this example is as follows:

[Formula 25]

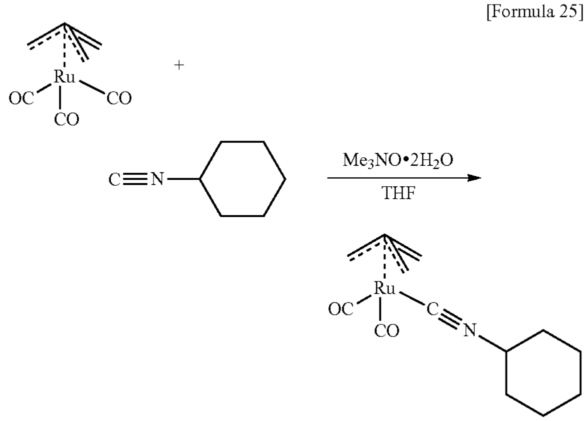

Example 5: To a flask containing 100 ml of tetrahydrofuran, 3.67 g (15.3 mmol) of [tricarbonyl-(η4-methylene-1,3-propanediyl)ruthenium], 2.15 g (26.8 mmol) of 3-isocyanopropionitrile, and 2.0 g (18.4 mmol) of trimethylamine N-oxide/dihydrate were added, and the resultant was heated at 60° C. for 12 hours. A solid obtained by distilling off the solvent under reduced pressure was dissolved in n-hexane, and the resultant was purified with an alumina column. The thus obtained solution was distilled off under reduced pressure to obtain 2.38 g (8.2 mmol) of a white solid as a target (yield: 53%). The synthesis reaction performed in this example is as follows:

[Formula 26]

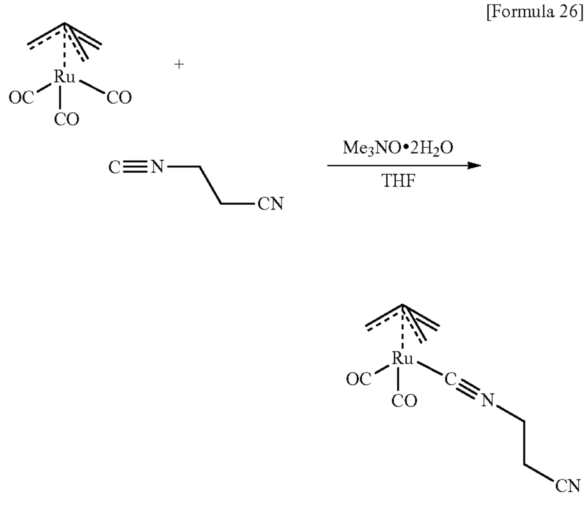

Example 6: To a flask containing 150 ml of tetrahydrofuran, 4.0 g (15.0 mmol) of [tricarbonyl-(η4-methylene-1,3-propanediyl)ruthenium], 3.78 g (30.0 mmol) of 3-(N-diethylamino)propionitrile, and 1.70 g (22.5 mmol) of trimethylamine N-oxide/dihydrate were added, and the resultant was heated at 60° C. for 18 hours. An oil obtained by distilling off the solvent was dissolved in n-hexane, and the resultant was purified with an alumina column. The thus obtained solution was distilled off under reduced pressure to obtain 3.03 g (8.98 mmol) of a colorless liquid as a target (yield: 60%). The synthesis reaction performed in this example is as follows:

[Formula 27]

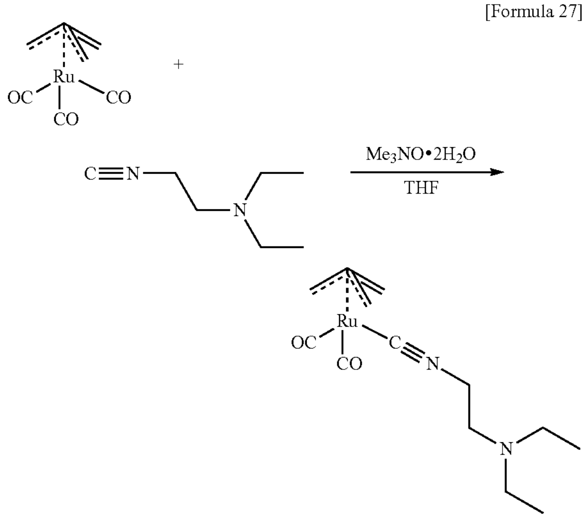

Example 7: To a flask containing 40 ml of tetrahydrofuran, 1.0 g (4.2 mmol) of [tricarbonyl-(η4-methylene-1,3-propanediyl)ruthenium], 3.3 g (42 mmol) of pyridine, and 3.0 g (9.2 mmol) of trimethylamine N-oxide/dihydrate were added, and the resultant was stirred at room temperature 18 hours. A residue obtained by distilling off the solvent under reduced pressure was dissolved in n-hexane, and the resultant was purified with an alumina column. The thus obtained solution was distilled off under reduced pressure to obtain 0.66 g (2.3 mmol) of a yellow solid as a target (yield: 55%). The synthesis reaction performed in this example is as follows:

[Formula 28]

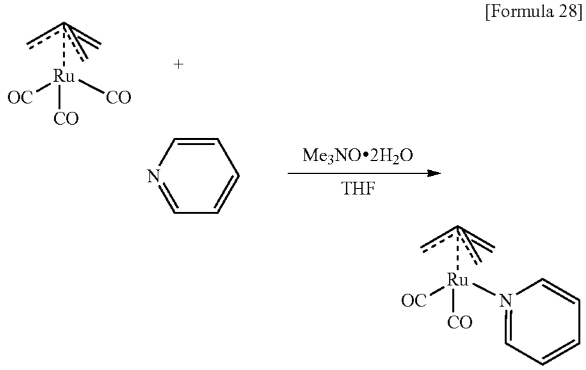

Example 8: To a flask containing 25 ml of tetrahydrofuran, 0.60 g (2.5 mmol) of [tricarbonyl-(η4-methylene-1,3-propanediyl)ruthenium], 0.52 g (5.0 mmol) of 4-cyanopyridine, and 0.30 g (3.8 mmol) of trimethylamine N-oxide/dihydrate were added, and the resultant was heated at 60° C. for 12 hours. A solid obtained by distilling off the solvent under reduced pressure was dissolved in n-hexane, and the resultant was purified with an alumina column. The thus obtained solution was distilled off under reduced pressure to obtain 0.39 g (1.3 mmol) of a yellow solid as a target (yield: 50%). The synthesis reaction performed in this example is as follows:

[Formula 29]

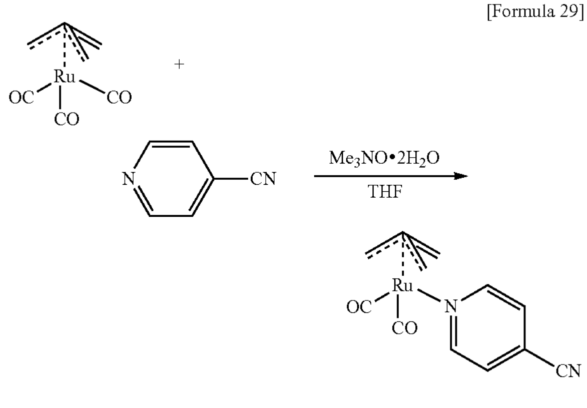

Example 9: To a flask containing 25 ml of tetrahydrofuran, 0.66 g (2.5 mmol) of [tricarbonyl-(η4-methylene-1,3-propanediyl)ruthenium], and 0.56 g (5.0 mmol) of trimethylamine N-oxide/dihydrate were added, and the resultant was heated at 60° C. for 1 hour. A solid obtained by distilling off the solvent under reduced pressure was dissolved in n-hexane, and the resultant was purified with an alumina column. The thus obtained solution was distilled off under reduced pressure to obtain 0.27 g (1.0 mmol) of a white solid as a target (yield: 40%). The synthesis reaction performed in this example is as follows:

[Formula 30]

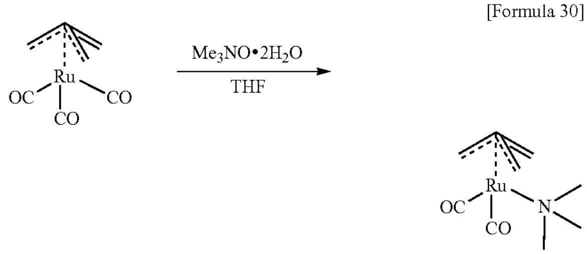

Example 10: To a flask containing 25 ml of tetrahydrofuran, 0.66 g (2.5 mmol) of [tricarbonyl-(η4-methylene-1,3-propanediyl)ruthenium], 0.34 g (5.0 mmol) of imidazole, and 0.19 g (2.5 mmol) of trimethylamine N-oxide/dihydrate were added, and the resultant was heated at 60° C. for 3 hours. A solid obtained by distilling off the solvent under reduced pressure was dissolved in n-hexane, and the resultant was purified with an alumina column. The thus obtained solution was distilled off under reduced pressure to obtain 0.21 g (0.75 mmol) of a yellow solid as a target (yield: 30%). The synthesis reaction performed in this example is as follows:

[Formula 31]

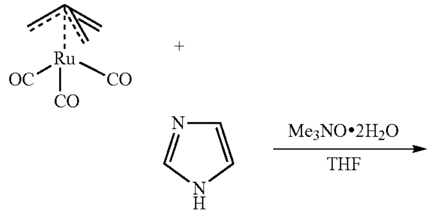

-continued

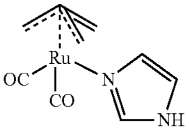

Example 11: To a flask containing 50 ml of tetrahydrofuran, 1.2 g (5.0 mmol) of [tricarbonyl-(η4-methylene-1,3-propanediyl)ruthenium], 1.44 g (15 mmol) of (1-ethylimidazole), and 0.60 g (7.5 mmol) of trimethylamine N-oxide/dihydrate were added, and the resultant was heated at 60° C. for 1 hour. A residue obtained by distilling off the solvent under reduced pressure was dissolved in n-hexane, and the resultant was purified with an alumina column. The thus obtained solution was distilled off under reduced pressure to obtain 0.99 g (3.2 mmol) of a yellow liquid as a target (yield: 65%). The synthesis reaction performed in this example is as follows:

[Formula 32]

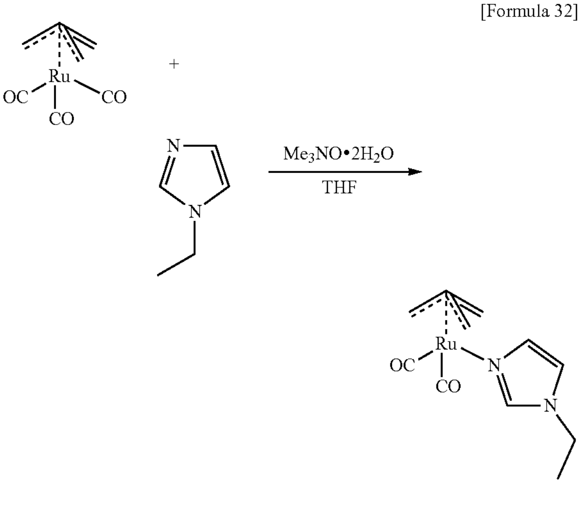

Example 12: To a flask containing 40 ml of tetrahydrofuran, 0.66 g (2.5 mmol) of [tricarbonyl-(η4-methylene-1,3-propanediyl)ruthenium], 0.40 g (5.0 mmol) of pyridazine, and 0.19 g (5.0 mmol) of trimethylamine N-oxide/dihydrate were added, and the resultant was heated at 60° C. for 3 hours. A solid obtained by distilling off the solvent under reduced pressure was dissolved in n-hexane, and the resultant was purified with an alumina column. The thus obtained solution was distilled off under reduced pressure to obtain 0.23 g (0.80 mmol) of a yellow solid as a target (yield: 32%). The synthesis reaction performed in this example is as follows:

[Formula 33]

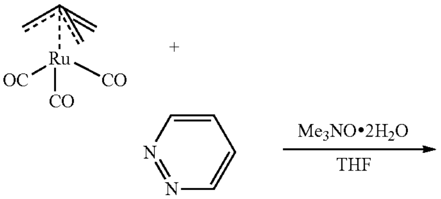

-continued

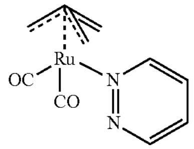

Example 13: To a flask containing 40 ml of tetrahydrofuran, 0.66 g (2.5 mmol) of [tricarbonyl-(η4-methylene-1, 3-propanediyl)ruthenium], 0.40 g (5.0 mmol) of pyrimidine, and 0.19 g (5.0 mmol) of trimethylamine N-oxide/dihydrate were added, and the resultant was heated at 60° C. for 3 hours. A solid obtained by distilling off the solvent under reduced pressure was dissolved in n-hexane, and the resultant was purified with an alumina column. The thus obtained solution was distilled off under reduced pressure to obtain 0.22 g (0.75 mmol) of a yellow solid as a target (yield: 30%). The synthesis reaction performed in this example is as follows:

[Formula 34]

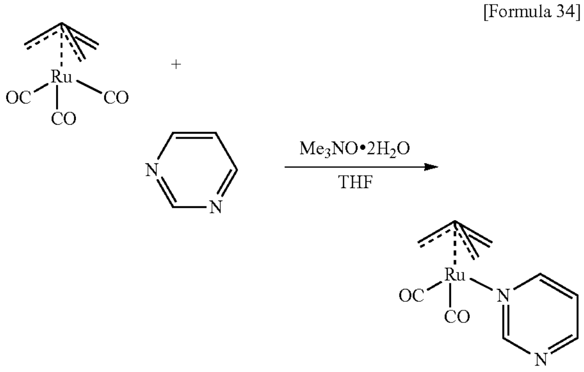

Example 14: To a flask containing 40 ml of tetrahydrofuran, 0.66 g (2.5 mmol) of [tricarbonyl-(η4-methylene-1, 3-propanediyl)ruthenium], 0.40 g (5.0 mmol) of pyrazine, and 0.19 g (5.0 mmol) of trimethylamine N-oxide/dihydrate were added, and the resultant was heated at 60° C. for 3 hours. A solid obtained by distilling off the solvent under reduced pressure was dissolved in n-hexane, and the resultant was purified with an alumina column. The thus obtained solution was distilled off under reduced pressure to obtain 0.22 g (0.75 mmol) of a yellow solid as a target (yield: 30%). The synthesis reaction performed in this example is as follows:

[Formula 35]

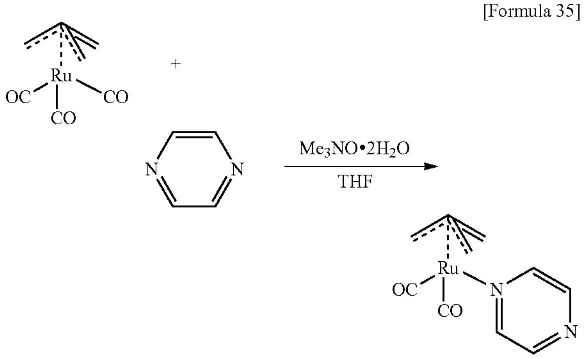

As described in the respective Examples, it could be confirmed in the present embodiment that the organoruthenium compounds in which the trimethylenemethane-based ligand ($L_1$) and the various ligands X (the isocyanide ligand ($L_2$), the pyridine ligand ($L_3$), the amine ligand ($L_4$), the imidazole ligand ($L_5$), the pyridazine ligand ($L_6$), the pyrimidine ligand ($L_7$), and the pyrazine ligand ($L_8$)) coordinated to ruthenium could be synthesized.

Evaluation of Physical Properties]

Among the organorutheniums compounds produced in the present embodiment, the organoruthenium compounds of Example 1 (dicarbonyl-(2-isocyano-2-methylpropane)-(η4-methylene-1,3-propanediyl) ruthenium: ligand $X=L_2$, $R_1$=tert-butyl), Example 3 (dicarbonyl-(2-isocyano-2-butyl)-(η 4-methylene-1,3-propanediyl) ruthenium: ligand $X=L_2$, $R_1$=sec-butyl group), and Example 6 (dicarbonyl-(2-isocyano-2-methyl)-(η4-methylene-1,3-propanediyl) ruthenium: ligand $X=L_3$, all of $R_2$ to $R_6$=hydrogen) were evaluated for thermal stability and vaporization property.

Besides, in the present embodiment, for comparison with the Examples described above, (η4-methylene-1,3-propanediyl)tricarbonyl ruthenium in which trimethylenemethane (R=hydrogen) coordinated as the trimethylenemethane-based ligand ($L_1$) and three carbonyl groups coordinated was synthesized as Reference Example 1 as follows.

Reference Example 1: 50.0 g (97.5 mmol) of tricarbonyl-dichlororuthenium dimer was suspended in 1700 ml of tetrahydrofuran, and 300 ml of a solution of 29.2 g of (231.6 mmol) of 3-chloro-2-(chloromethyl)-1-propene in tetrahydrofuran was added thereto. To the resultant, 19.7 g (800 mmol) of magnesium turnings were slowly added, followed by stirring at room temperature for 3 hours. To the resultant reaction mixture, 5 mL of methanol was added for quenching, and the solvent was distilled off under reduced pressure. The thus obtained residue was extracted with 30 mL of pentane three times, and the solvent was distilled off under reduced pressure. The thus obtained oil was purified by sublimation to obtain 16.3 g (68.3 mmol) of a colorless liquid as a target (yield: 35%). The synthesis reaction is as follows:

[Formula 36]

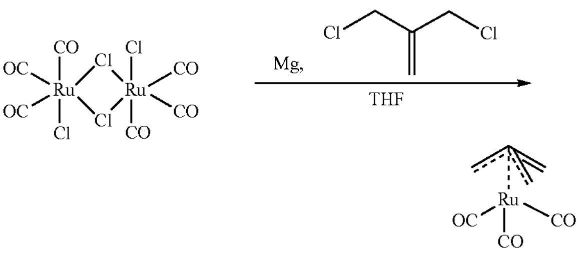

Study of Thermal Stability

The evaluation of thermal stability was performed by measuring a decomposition starting temperature by differential scanning calorimetry (DSC). In the DSC, DSC3500-ASC manufactured by NETZSCH was used as a measurement apparatus, and the measurement was performed with the weight of a sample set to 1.0 mg, nitrogen used as a carrier gas, at a scanning rate of 5° C./min in a range of −50° C. to 400° C.

In this study, the DSC was performed also on (1,3-cyclohexadiene)tricarbonyl ruthenium (Formula 2) described above as the conventional technique (Comparative Example 1). The decomposition temperatures of the respective organoruthenium compounds measured by DSC are shown in Table 1. Besides, DSC results of the organoruthenium compounds of Example 1, Example 3, Example 6, Reference Example 1 and Comparative Example 1 are illustrated in FIG. 1 to FIG. 5.

TABLE 1

| | Decomposition Temperature |
|---|---|
| Example 1 | 231.6° C. |
| Example 3 | 240.0° C. |
| Example 6 | 200.0° C. |
| Reference Example 1 | 282.2° C. |
| Comparative Example 1 | 190.1° C. |

As described above, the decomposition temperature of (1,3-cyclohexadiene)tricarbonyl ruthenium (Formula 2) of Comparative Example 1 was 190.1° C. On the contrary, the decomposition temperatures of the organoruthenium compounds of Examples 1, 3, and 6 were 200° C. or more, and thus, it is deemed that the thermal stability is higher than that of Comparative Example. It is noted that the organoruthenium compound of Reference Example 1 also had a decomposition temperature higher than that of Comparative Example 1, and is deemed to be favorable from the viewpoint of the thermal stability.

Study of Vaporization Property

Figure 6:
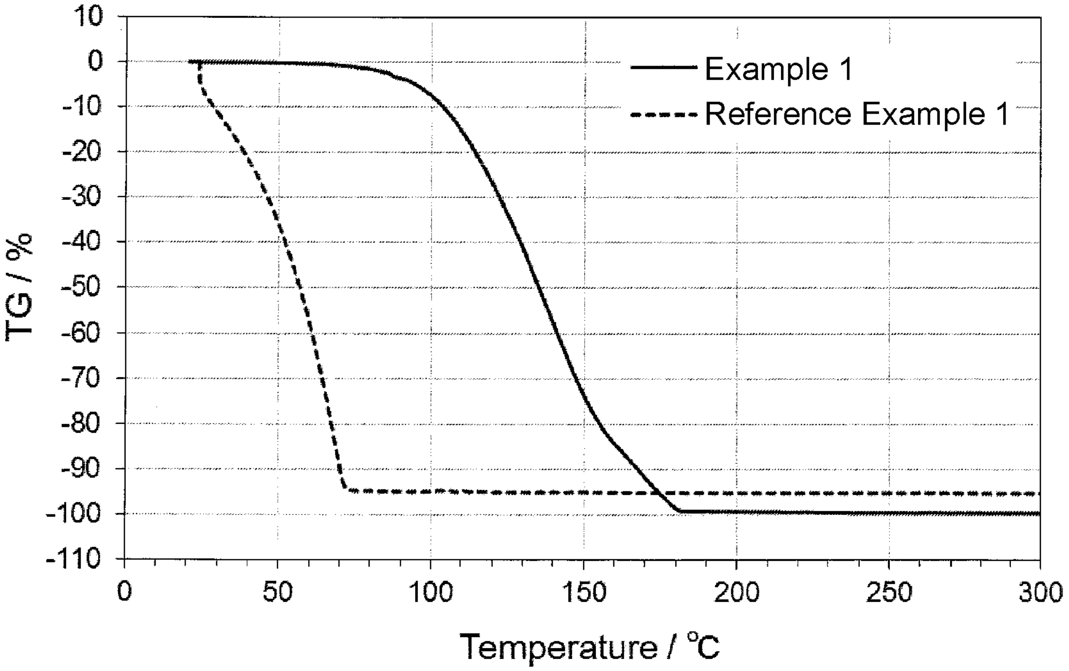
FIG. 6 is a diagram illustrating a TG curve of each organoruthenium compound of Example 1 and Reference Example 1.
Figure 7:
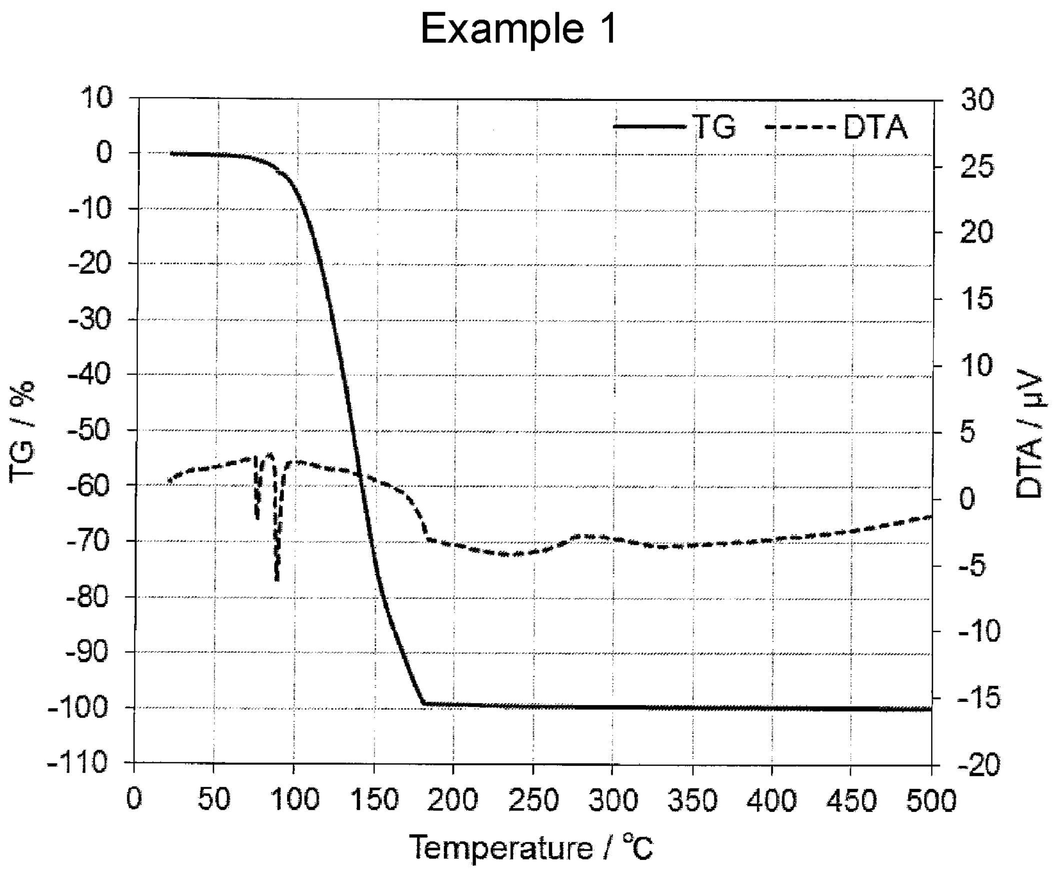
FIG. 7 is a diagram illustrating a TG-DTA curve of the organoruthenium compound of Example 1.
Figure 8:
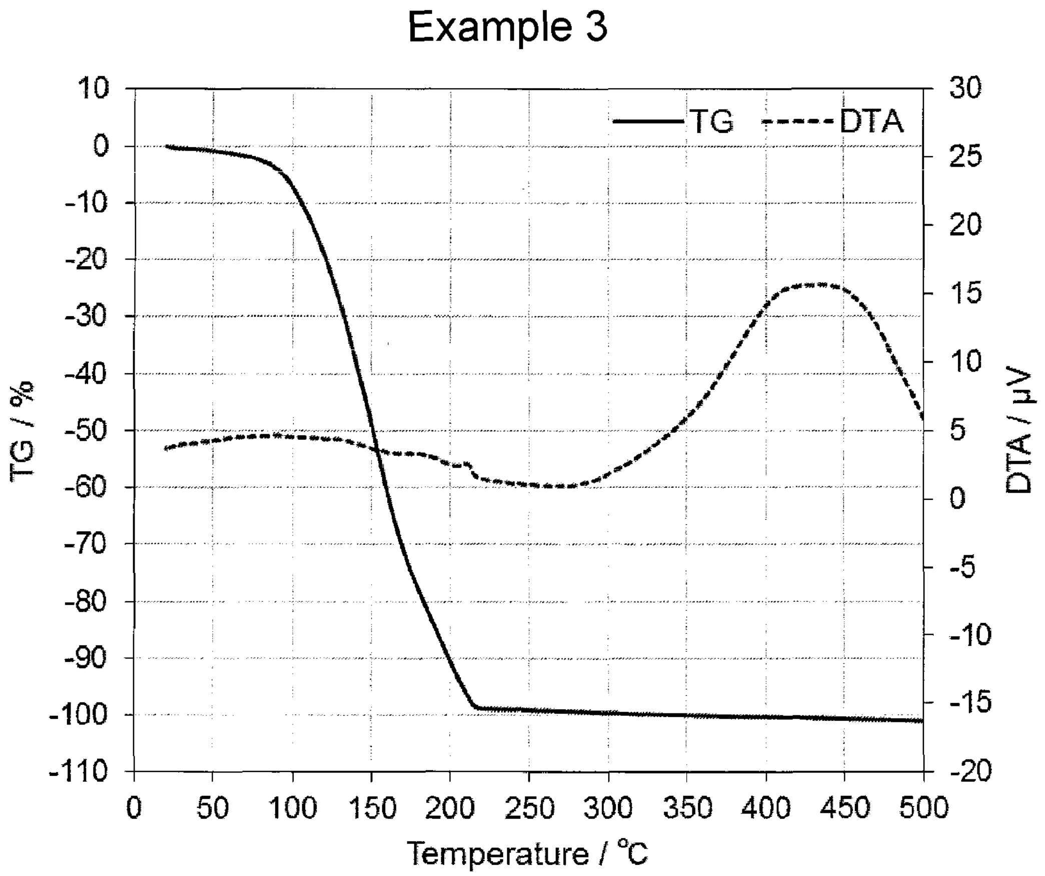
FIG. 8 is a diagram illustrating a TG-DTA curve of the organoruthenium compound of Example 3.
Figure 9:
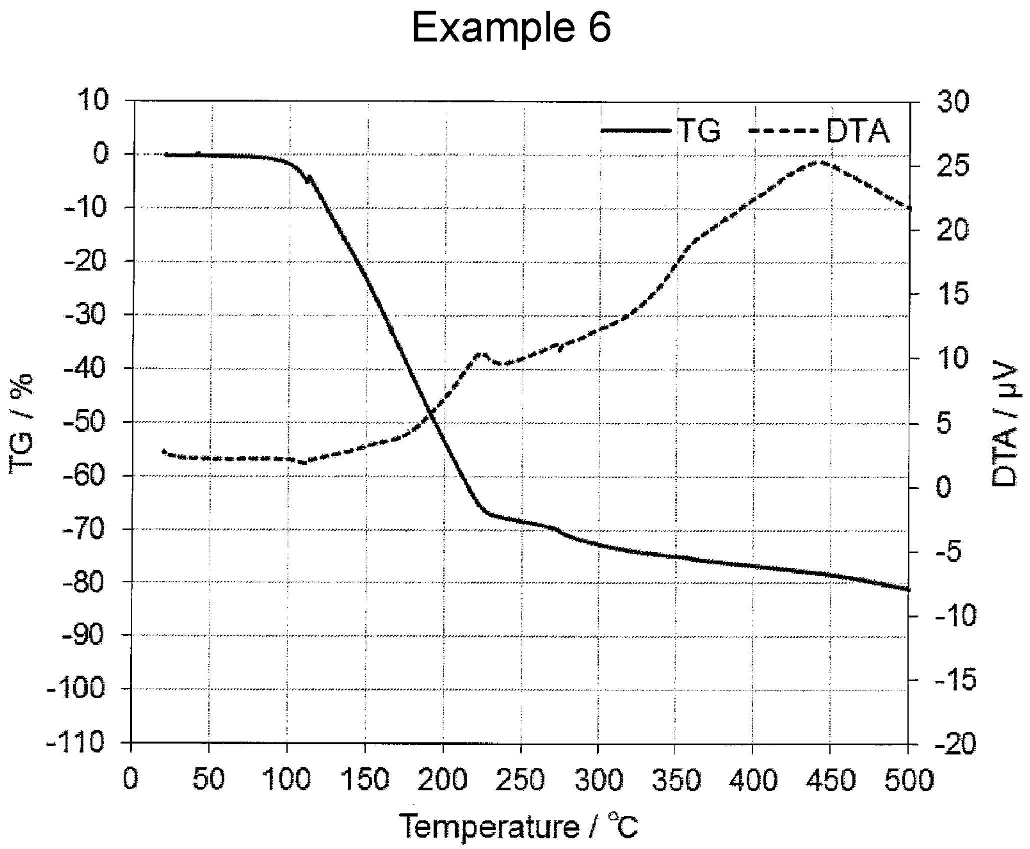
FIG. 9 is a diagram illustrating a TG-DTA curve of the organoruthenium compound of Example 6.

Next, regarding the organoruthenium compounds of Examples 1, 3, and 6 and Reference Example 1, the vaporization property was comparatively studied by thermogravimetric-differential thermal analysis (TG-DTA). In the TG-DTA, TG-DTA2000SA manufactured by BRUKER was used, a sample with a weight of 5 mg was filled in an aluminum cell, and change in a calorific value and a weight was observed in a nitrogen atmosphere at a temperature increase rate of 5° C./min in a measurement temperature range of from room temperature to 500° C. FIG. 6 illustrates comparison of a TG curve between the organoruthenium compounds of Example 1 and Reference Example 1. Besides, FIG. 7 to FIG. 9 respectively illustrate TG-DTA results of Example 1, Example 3, and Example 6.

The organoruthenium compound of Reference Example 1 (in which the three carbonyl ligands coordinate) started to vaporize substantially at the same time as the start of the measurement at around normal temperature. Thus, the vapor pressure of the organoruthenium compound of Reference Example 1 is deemed to be high, but is deemed to be too high. In other words, it is deemed that the organoruthenium compound of Reference Example 1 has favorable thermal stability but is rather disadvantageous in the vaporization property (vapor pressure).

On the contrary, the organoruthenium compound of Example 1 (ligand X=isocyanide ligand) was inhibited from vaporizing and stable up to about 60° C. Besides, based on the inclination of the TG curve, rapid vaporization occurred in Example 1. It is deemed, based on this result, that the vaporization property was adjusted by introducing the ligand X (isocyanide ligand) into the compound of Reference Example in which only the carbonyl ligands coordinated. In Example 1, the vaporization is inhibited under room temperature environment, and hence, it is presumed that temperature control and quality control in film formation of a raw material for chemical deposition are further eased. Besides, in Example 1, vaporization occurs rapidly at the time of film formation, and the organoruthenium compound easily vaporizes to a raw material gas.

It was confirmed also in Examples 3 and 6 that the organoruthenium compounds did no vaporize at normal temperature but easily vaporized when heated.

[Film Formation Test]

The organoruthenium compound of Example 1 of the present embodiment (dicarbonyl-(2-isocyano-2-methylpropane)-(η4-methylene-1,3-propanediyl)ruthenium) was subjected to a film formation test to study the film formability. Besides, for comparison, dicarbonyl-bis(5-methyl-2,4-hexanediketonato)ruthenium (Formula 5, Patent Document 4) corresponding to a conventional raw material for chemical deposition was also subjected to the film formation test (Comparative Example 2).

With the organoruthenium compound of the present embodiment used as a raw material, a ruthenium thin film was formed with a CVD apparatus (hot wall CVD film forming apparatus). Film forming conditions were as follows:

Substrate material: Si

Carrier gas (nitrogen gas): 10 sccm, 200 sccm

Reaction gas (hydrogen gas): 10 sccm, 200 sccm

Film forming pressure: 50 torr

Film forming time: 15 min, 30 min

Film forming temperature: 260° C., 250° C.

Figure 10:
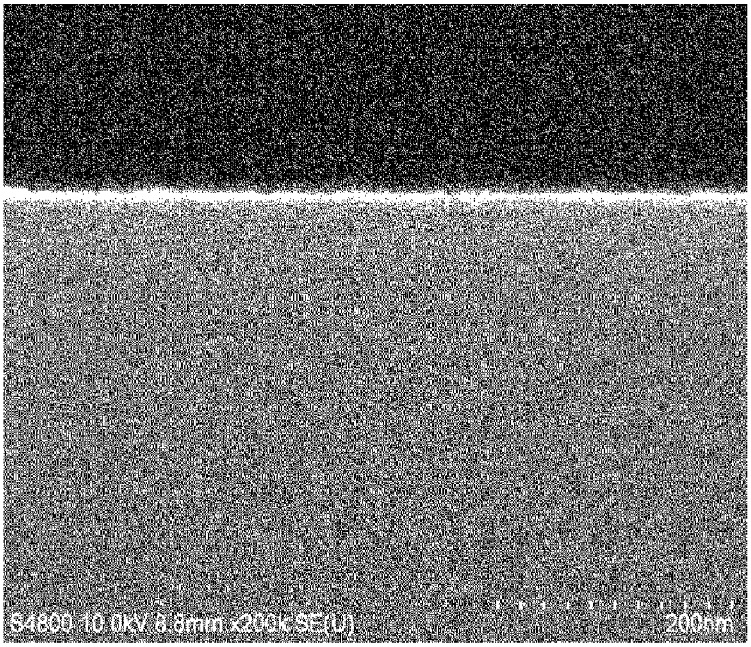
FIG. 10 illustrates an SEM image of a cross section in the thickness direction of a ruthenium thin film of Example 1 formed in First Embodiment (reaction gas: hydrogen)

A ruthenium thin film was formed under the above-described conditions, and a thickness and a resistance value of the resultant were measured. The thickness of the ruthenium thin film was obtained by measuring thicknesses in a plurality portions based on a result of XRF (X-ray reflection fluorescence) using EA1200VX manufactured by Hitachi High-Tech Science Corporation, and calculating an average of the thicknesses. Besides, the resistance value was measured by a four point probe method. Results of the measurement are shown in Table 2. FIG. 10 illustrate results of observation, with a scanning electron microscope (SEM), of cross sections in the thickness direction of the ruthenium thin films of Example 1 and Example 3.

TABLE 2

| Sample | Substrate Material | Nitrogen Gas (sccm) | Hydrogen Gas (sccm) | Film Forming Pressure (torr) | Film Forming Time (min) | Film Forming Temperature (° C.) | Ru Film Thickness (nm) | Specific Resistance (μΩ · cm) |
|---|---|---|---|---|---|---|---|---|
| Example 1 | Si | 10 | 200 | 50 | 15 | 260 | 18.7 | 20.1 |
| | | 200 | | | | | 5.9 | 33.9 |
| | | | 10 | | | | 5.8 | 55.8 |
| Comparative Example 2 | | 10 | 200 | | 30 | 250 | 17.8 | 65.3 |

As illustrated in FIG. 10, it can be confirmed that the organoruthenium compound of Example 1 forms a uniform ruthenium thin film having a smooth surface. The organoruthenium compound of the present invention has high reactivity with hydrogen used as the reaction gas, and enables efficient film formation. Results of the film formation test are compared between Comparative Example 2 corresponding to the conventional raw material for chemical deposition and the present invention. In the present invention, reactivity with hydrogen used as the reaction gas is higher than in Comparative Example 2, and a ruthenium thin film having a sufficient thickness is formed in short time, and thus, efficient film formation can be performed.

Besides, regarding the quality of the thin film, it can be confirmed that a high quality ruthenium thin film having largely lower specific resistance as compared with that of Comparative Example 2 is formed. Differently from the compound of Comparative Example 2, the organoruthenium compound of the present invention does not contain an oxygen atom capable of directly coordinating to ruthenium, and has favorable reactivity with hydrogen or the like. Therefore, a possibility of oxygen mixture in the ruthenium thin film is low, and hence a high quality ruthenium thin film having low specific resistance can be formed.

Second Embodiment: In the present embodiment, a film formation test of a ruthenium thin film was performed with the organoruthenium compounds of Example 1 and Comparative Example 2 of First Embodiment used as raw materials, and with oxygen applied as the reaction gas. For the film formation, the same CVD apparatus (hot wall CVD film forming apparatus) as that used in First Embodiment was used. Film forming conditions were as follows:

Substrate material: Si
Carrier gas (nitrogen gas): 50 sccm
Reaction gas (oxygen gas): 10 sccm
Film forming pressure: 2 torr
Film forming time: 30 min
Film forming temperature: 260° C., 250° C.

A ruthenium thin film was formed under the above-described conditions, and a thickness and a resistance value of the resultant were measured. The methods for measuring the thickness and the resistance value of the ruthenium thin film were the same as those employed in First Embodiment. Results of the measurement are shown in Table 3. Besides, FIG. 11 respectively illustrate SEM images of the ruthenium thin films of Example 1.

TABLE 3

| Sample | Substrate Material | Nitrogen Gas (sccm) | Oxygen Gas (sccm) | Film Forming Pressure (torr) | Film Forming Time (min) | Film Forming Temperature (° C.) | Ru Film Thickness (nm) | Specific Resistance (μΩ · cm) |
|---|---|---|---|---|---|---|---|---|
| Example 1 | Si | 50 | 10 | 2 | 30 | 260 | 36.5 | 43.7 |
| Comparative Example 2 | | | | | | 250 | 21.6 | 46.4 |

Figure 11:
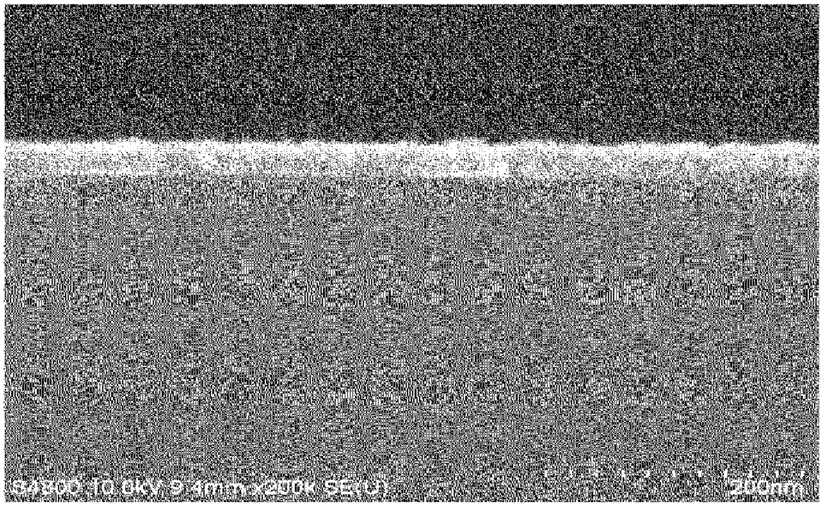
FIG. 11 illustrates an SEM image of a cross section in the thickness direction of a ruthenium thin film of Example 1 formed in Second Embodiment (reaction gas: oxygen)

It is understood, based on Table 3 and FIG. 11, that the organoruthenium compounds of Example 1 can form a ruthenium thin film even with oxygen used as the reaction gas. Also in the present embodiment, a uniform ruthenium thin film having a smooth surface is formed. Besides, the organoruthenium compound of Example 1 can efficiently form a film because its deposition rate is higher than that of the organoruthenium compound of Comparative Example 2. In addition, the ruthenium thin film formed in Example 1 is deemed as a high quality film having lower specific resistance than the ruthenium thin film formed in Comparative Example 2. This difference in the specific resistance is caused probably because generation of a ruthenium oxide is inhibited in using the organoruthenium compound of Example 1 even when oxygen is used as the reaction gas.

INDUSTRIAL APPLICABILITY

An organoruthenium compound contained in a raw material for chemical deposition of the present invention has high thermal stability, and can form a ruthenium thin film even with a reducing gas such as hydrogen used as a reaction gas. Besides, even when oxygen is used as the reaction gas, it can form a good ruthenium thin film. The raw material for chemical deposition of the present invention has a favorable vapor pressure, and is good also in handleability. The present invention is suitable for use as a wiring/electrode material of a semiconductor device such as a DRAM.

What is claimed is:

1. A chemical deposition method for a ruthenium thin film or a ruthenium compound thin film, comprising vaporizing a raw material to obtain a raw material gas, and introducing a reaction gas and the raw material gas together onto a substrate surface, while heating the raw material gas and the reaction gas, wherein the raw material comprises an organoruthenium compound represented by the following Formula 1, in which a trimethylenemethane-based ligand ($L_1$), and two carbonyl ligands and a ligand X coordinate to divalent ruthenium:

$RuL_1(CO)_2X$ [Formula 1]

wherein the trimethylenemethane-based ligand ($L_1$) is represented by the following Formula 2, and the ligand X is any one of an isocyanide ligand ($L_2$), a pyridine ligand ($L_3$), an amine ligand ($L_4$), an imidazole ligand ($L_5$), a pyridazine ligand ($L_6$), a pyrimidine ligand ($L_7$), and a pyrazine ligand ($L_8$) represented by the following Formula 3 to Formula 7:

[Formula 2]

$L_1$ =

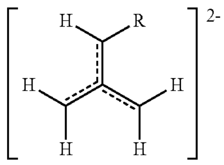

wherein a substituent R of the ligand $L_1$ is any one of hydrogen, a linear or branched alkyl group having 1 to 8 carbon atoms, a cyclic alkyl group having 3 to 9 carbon atoms, a linear or branched alkenyl group having 2 to 8 carbon atoms, a linear or branched amino group;

[Formula 3]

$L_2$ = 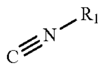

wherein a substituent $R_1$ of the ligand $L_2$ is any one of hydrogen, a linear or branched alkyl group having 1 to 8 carbon atoms;

[Formula 4]

$L_3$ = 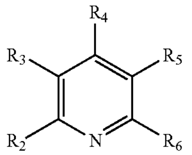

wherein each of substituents $R_2$ to $R_6$ of the ligand $L_3$ is any one of hydrogen, a linear or branched alkyl group having 1 to 5 carbon atoms;

[Formula 5]

$L_4$ = 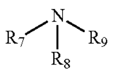

wherein each of substituents $R_7$ to $R_9$ of the ligand $L_4$ is a linear or branched alkyl group having 1 to 5 carbon atoms;

[Formula 6]

$L_5$ = 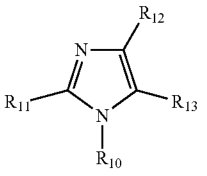

wherein a substituent $R_{10}$ of the ligand $L_5$ is any one of hydrogen, a linear or branched alkyl group having 1 to 8 carbon atoms;

$L_6$ = 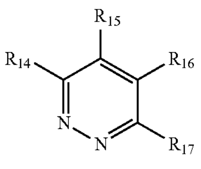

wherein each of substituents $R_{14}$ to $R_{17}$ of the ligand $L_6$ is any one of hydrogen, a linear or branched alkyl group having 1 to 5 carbon atomss;

[Formula 8]

$L_7$ = 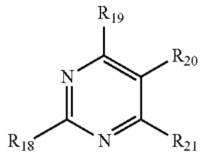

wherein each of substituents $R_{18}$ to $R_{21}$ of the ligand $L_7$ is any one of hydrogen, a linear or branched alkyl group having 1 to 5 carbon atoms; and $L_8$ = 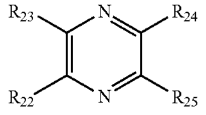

wherein each of substituents $R_{22}$ to $R_{25}$ of the ligand Lg is any one of hydrogen, a linear or branched alkyl group having 1 to 5 carbon atoms.

2. The chemical deposition method according to claim 1, wherein the reaction gas is a reducing gas.

3. The chemical deposition method according to claim 2, wherein the reducing gas is a gas of any one selected from the group consisting of hydrogen, ammonia, hydrazine, formic acid, and an alcohol.

4. The chemical deposition method according to claim 1, wherein the reaction gas is either of an oxidizing gas and a gas of an oxygen-containing reactant.

5. The chemical deposition method according to claim 4, wherein the oxidizing gas is a gas of any one of oxygen and ozone, and the gas of an oxygen-containing reactant is a gas of any one of water and an alcohol.

6. The chemical deposition method according to claim 1, wherein the heating is performed at a film forming temperature is within a range from 150° C. to 350° C.

7. The chemical deposition method according to claim 2, wherein the heating is performed at a film forming temperature within a range from 150° C. to 350° C.

8. The chemical deposition method according to claim 3, wherein the heating is performed at a film forming temperature within a range from 150° C. to 350° C.

9. The chemical deposition method according to claim 1, wherein the substituent R of the trimethylenemethane-based ligand ($L_1$) is any one of hydrogen, a methyl group, an ethyl group, a n-propyl group, an isopropyl group, a n-butyl group, an isobutyl group, a sec-butyl group, a tert-butyl group, a n-pentyl group, an isopentyl group, and a neopentyl group.

10. The chemical deposition method according to claim 1, wherein the ligand X is the isocyanide ligand ($L_2$), and $R_1$ is any one of a methyl group, an ethyl group, a n-propyl group, an isopropyl group, a n-butyl group, an isobutyl group, a sec-butyl group, and a tert-butyl group.

11. The chemical deposition method according to claim 1, wherein ligand X is the pyridine ligand ($L_3$), and all of $R_2$ to $R_6$ are hydrogen, all of $R_2$, $R_4$ and $R_6$ are methyl groups, and $R_3$ and $R_5$ are hydrogen, or all of $R_2$, $R_3$, $R_5$ and $R_6$ are hydrogen, and $R_4$ is any one of a methyl group, an ethyl group, an isopropyl group, and a tert-butyl group.

12. The chemical deposition method according to claim 1, wherein the ligand X is the amine ligand ($L_4$), and all of $R_7$ to $R_9$ are any one of a methyl group, an ethyl group, a n-propyl group, an isopropyl group, and a n-butyl group, or both $R_7$ and $R_8$ are any one of a methyl group, an ethyl group, a n-propyl group, an isopropyl group, a n-butyl group, and a tert-butyl group, and $R_9$ is hydrogen.

13. The chemical deposition method according to claim 1, wherein the ligand X is the imidazole ligand ($L_5$), and all of $R_{10}$ to $R_{13}$ are hydrogen, $R_{10}$ is any one of a methyl group, an ethyl group, an isopropyl group, and a tert-butyl group, and $R_{11}$ to $R_{13}$ are any one of hydrogen, a methyl group and an ethyl group, or $R_{10}$ is any one of a methyl group, an ethyl group, an isopropyl group, and a tert-butyl group, and all of $R_{11}$ to $R_{13}$ are any one of hydrogen, a methyl group, and an ethyl group.

* * * * *